United States Patent
Palmer

(10) Patent No.: US 11,086,231 B2
(45) Date of Patent: Aug. 10, 2021

(54) ARRAY DESCRIPTION SYSTEM FOR LARGE PATTERNS

(71) Applicant: NIKON CORPORATION, Tokyo (JP)

(72) Inventor: Shane R. Palmer, Oro Valley, AZ (US)

(73) Assignee: NIKON CORPORATION

( * ) Notice: Subject to any disclaimer, the term of this patent is extended or adjusted under 35 U.S.C. 154(b) by 185 days.

(21) Appl. No.: 15/901,756

(22) Filed: Feb. 21, 2018

(65) Prior Publication Data

US 2018/0181010 A1    Jun. 28, 2018

Related U.S. Application Data

(62) Division of application No. 14/155,280, filed on Jan. 14, 2014, now abandoned.

(60) Provisional application No. 61/752,900, filed on Jan. 15, 2013.

(51) Int. Cl.
*G03F 7/20* (2006.01)

(52) U.S. Cl.
CPC ...... *G03F 7/70508* (2013.01); *G03F 7/70291* (2013.01)

(58) Field of Classification Search
CPC .......................... G03F 7/70508; G03F 7/70291
See application file for complete search history.

(56) References Cited

U.S. PATENT DOCUMENTS

| | | | |
|---|---|---|---|
| 7,075,699 | B2 | 7/2006 | Oldham et al. |
| 2005/0068599 | A1* | 3/2005 | Mushika ............. G03F 7/70283 359/237 |
| 2007/0064298 | A1 | 3/2007 | Chen |
| 2012/0057141 | A1 | 3/2012 | Owa et al. |
| 2012/0264066 | A1* | 10/2012 | Chen ................... G03F 7/70275 430/322 |
| 2013/0188166 | A1 | 7/2013 | Sandstrom |
| 2013/0278912 | A1 | 10/2013 | Owa et al. |
| 2013/0314683 | A1 | 11/2013 | Watanabe et al. |

OTHER PUBLICATIONS

Hamermesh, Morton, Group Theory and Physical Problems, The Symmetric Group, 1964, Ch. 7 pp. 199-209, Addison Wesley, Reading, MA.

* cited by examiner

*Primary Examiner* — Daborah Chacko-Davis
(74) *Attorney, Agent, or Firm* — Roeder & Broder LLP; Steven G. Roeder

(57) ABSTRACT

A method for describing an array of elements includes the steps of providing an array description system that includes a library of possible alternative designations; and describing the array of elements using at least one of the alternative designations. The library of possible alternative designations includes one or more of the following (i) a line designation, (ii) a column designation, (iii) a square designation, (iv) a rectangle designation, (v) a cross designation, (vi) a diagonal designation, (vii) a complex designation, (viii) a mosaic designation, (ix) an overlap designation, (x) a power designation, (xi) a border designation, (xii) a corner flip designation, (xiii) a mirror image designation, (xiv) a repeat designation, and (xv) a glide designation.

18 Claims, 20 Drawing Sheets x → x
y → y x → y
y → -x x → -x
y → -y x → -y
y → x x → -x
y → y x → y
y → x x → x
y → -y x → -y
y → -x $(Mz^{16})^6$ ; $(M^4Rz^3R^3M^6)^3$ ; $(M^{16})^7$

ARRAY DESCRIPTION SYSTEM FOR LARGE PATTERNS

RELATED APPLICATION

The present application is a divisional application of U.S. application Ser. No. 14/155,280 filed on Jan. 14, 2014 and entitled "ARRAY DESCRIPTION SYSTEM FOR LARGE PATTERNS". U.S. application Ser. No. 14/155,280 claims priority on U.S. Provisional Ser. No. 61/752,900, filed Jan. 15, 2013, and entitled "ARRAY DESCRIPTION SYSTEM FOR LARGE PATTERNS". As far as permitted, the contents of U.S. application Ser. No. 14/155,280 and U.S. Provisional Ser. No. 61/752,900 are incorporated herein by reference.

BACKGROUND

Lithography systems are commonly used to transfer images from a reticle onto a semiconductor wafer during semiconductor processing. Typical lithography systems include an illumination system, a reticle stage assembly that positions a reticle, an optical assembly and a wafer stage assembly that positions a semiconductor wafer. The illumination system includes an illumination source that generates an illumination beam, and an illumination optical assembly that directs the illumination beam at the reticle.

Recently, large mirror arrays are being used in certain lithography systems. Unfortunately, it can be difficult to control these mirror arrays.

SUMMARY

The present embodiment is directed to a method for describing an array of elements, the method including the steps of providing an array description system that includes a library of possible alternative designations; and describing the array of elements using at least one of the alternative designations. The present embodiment is directed to viewing operator; method to describe complex patterns including mosaic (checkerboard) and non-mosaic patterns, a method to take patterns already described to describe them in a more condensed manner; and a method for describing modified patterns.

In one embodiment, the library of possible alternative designations includes at least one of the following (i) a line designation, (ii) a column designation, (iii) a square designation, (iv) a rectangle designation, (v) a cross designation, (vi) a diagonal designation, (vii) a complex designation, (viii) a mosaic designation, (ix) an overlap designation, (x) a power designation, (xi) a border designation, (xii) a corner flip designation, (xiii) a mirror image designation, (xiv) a repeat designation, and (xv) a glide designation.

In another embodiment, the library of possible alternative designations includes at least two of the following (i) a line designation, (ii) a column designation, (iii) a square designation, (iv) a rectangle designation, (v) a cross designation, (vi) a diagonal designation, (vii) a complex designation, (viii) a mosaic designation, (ix) an overlap designation, (x) a power designation, (xi) a border designation, (xii) a corner flip designation, (xiii) a mirror image designation, (xiv) a repeat designation, and (xv) a glide designation.

In still another embodiment, the library of possible alternative designations includes at least three of the following (i) a line designation, (ii) a column designation, (iii) a square designation, (iv) a rectangle designation, (v) a cross designation, (vi) a diagonal designation, (vii) a complex designation, (viii) a mosaic designation, (ix) an overlap designation, (x) a power designation, (xi) a border designation, (xii) a corner flip designation, (xiii) a mirror image designation, (xiv) a repeat designation, and (xv) a glide designation.

In yet another embodiment, the library of possible alternative designations includes at least four of the following (i) a line designation, (ii) a column designation, (iii) a square designation, (iv) a rectangle designation, (v) a cross designation, (vi) a diagonal designation, (vii) a complex designation, (viii) a mosaic designation, (ix) an overlap designation, (x) a power designation, (xi) a border designation, (xii) a corner flip designation, (xiii) a mirror image designation, (xiv) a repeat designation, and (xv) a glide designation.

In alternative embodiments, the library of possible alternative designations includes at least five, six, seven, eight, nine, ten, eleven, twelve, thirteen, fourteen, or fifteen of the designations provided above.

In certain embodiments, the array of elements is a binary array, and the description system includes a first element designation and a second element designation.

The present embodiment is also directed to an exposure apparatus, a process for manufacturing a device that includes the steps of providing a substrate and forming an image on the substrate with the exposure apparatus described above. Further, the present embodiment is directed to an array description system for describing an array of elements.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIGS. 5A, 5B, and 5C are alternative element arrays and the corresponding array descriptions;

FIGS. 6A, 6B, 6C, and 6D are alternative element arrays and the corresponding array descriptions;

DESCRIPTION

Figure 1:
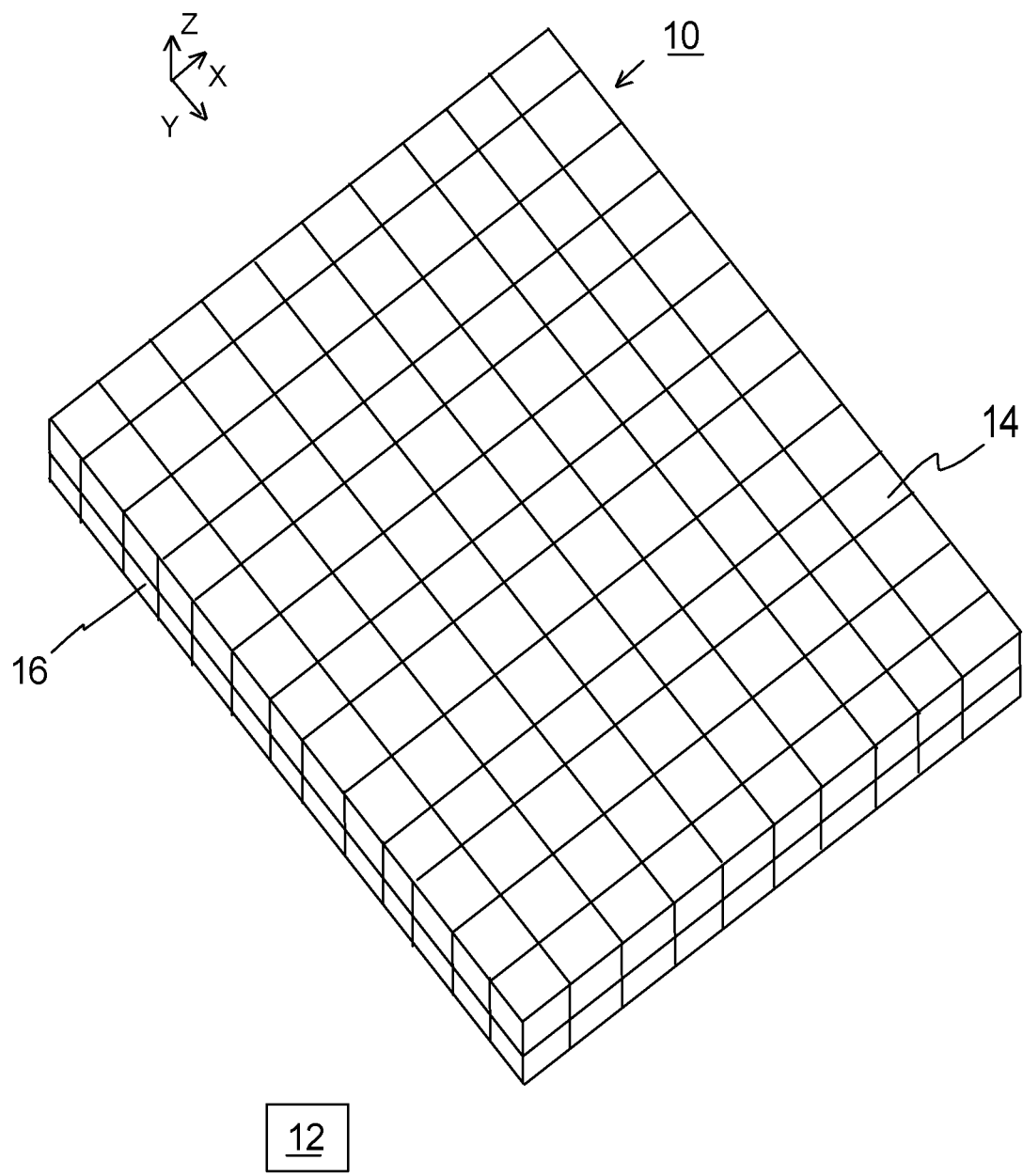
FIG. 1 is a perspective view of an element array and a control system that utilizes an array description system having features of the present embodiment.

FIG. 1 is a perspective view of an element array 10 and a control system 12 having features of the present embodiment. The design of these components can vary. In one embodiment, the element array 10 includes a plurality of individual elements 14 (illustrated as boxes and also referred to as a "pixel") arranged in a two dimensional array (pattern)

and a mover assembly 16 (illustrated as boxes) that can individually adjust each of the elements 14. The number of elements 14 and the design of the mover assembly 16 can be varied. In certain embodiments, the system is a binary system in which the mover assembly 16 individually moves each element 14 between two positions e.g. (i) a zero phase position (sometimes referred to as a "Z" or "0" position), and (ii) a pi phase position (sometimes referred to as a "P" or "1" position). It should also be noted that the zero phase position can also be referred to as a first element designation, and the pi phase position can also be referred to as a second element designation. A couple of the elements 14 are labeled in FIG. 1 for reference.

Alternatively, the mover assembly 16 can be designed to move the elements 14 between more than two positions A number of Figures include an orientation system that illustrates an X axis, a Y axis that is orthogonal to the X axis, and a Z axis that is orthogonal to the X and Y axes. It should be noted that any of these axes can also be referred to as the first, second, and/or third axes.

In one embodiment, each of the elements 14 is a mirror that redirects energy. In this embodiment, the design of each element will depend on the wavelength of light to be redirected by the elements 14. As an example, the element array 10 can include a plurality of mirror elements 14 that form a pixelated mask that can be used in an exposure apparatus or another type of device. In this example, if the mirror element array 10 is used in an exposure apparatus, the position of each of the mirror elements 14 will be constantly changed during the exposure process (as the wafer is moved) to control the phase of the light reflected off of each of the mirrors. Thus, it will be necessary for the control system 12 to precisely control the mover assembly 16.

As an overview, a certain embodiment is directed to a compact mathematical array description system that can be used to succinctly describe the arrangement (e.g. phase or position) of the plurality of elements 14 in the element array 10 at any given time. Stated in another fashion, the present embodiment is directed to a compact mathematical description that can be used to describe the phase or binary mirror pixilation starting point, i.e. the pixilation pattern of the mirrors, and subsequent change of the mirrors during stage motion.

The control system 12 can describe or store each of the arrangements using the compact description system provided herein to reduce the amount of data that has to be saved and processed. Further, the array description system can be used to accurately input the description of the desired element arrays 10 into the control system 12. As provided herein, the description system can be used to describe the condition of the elements on a pixelated mask or a maskless scanner. The method described in this disclosure reduces the data storage size to describe a large phase-shift or binary pixilation pattern on the maskless scanner. It may also be used for rapid input to change the patterns on the element array 10 as necessary.

The design of the elements 14 can vary. In one embodiment, each element 14 is a square shaped mirror. For example, the square shaped mirror can have a four micrometer, a one micrometer, 0.6 micrometer, or 0.1 micrometer square reflective surface. However, each element can have a different size or shape than illustrated or described herein.

The mover assembly 16 can include one or more actuators that can individually move the elements 14.

The control system 12 controls the mover assembly 16 to achieve the desired pattern of the element array 10. The control system 12 can include one or more processors.

Embodiments of the element array 10 and control system 12 are disclosed, for example, in U.S. Patent Publication Application Nos. 2013/0278912, 2013/0314683, or 2007/0064298, or U.S. Pat. No. 7,075,699. As far as permitted, the teachings of U.S. Patent Publication Application Nos. 2013/0278912, 2013/0314683, and 2007/0064298, and U.S. Pat. No. 7,075,699 are incorporated by reference.

The present description system can be used to describe large or small arrays. For example, the array description system can be used to describe the complex pixel patterns at any given time on a maskless scanner to transfer a pattern directly onto a workpiece, e.g. wafer. In this embodiment, the description system can be used to provide a compact description of the dark and clear field pixilation patterns for the maskless scanner. The present description system can also be used inside an optimization tool to change the pattern array for optical proximity effect ("OPE") or SMO calculations. Also, for the binary type of mirror array, the description system can be used to simply change the representation of the pi-phase mirror to the binary non-reflective mirror (on or off).

As provided herein, the start point reference and subsequent changes of the element array is essential in order to reduce overhead time for computing the optimal source and phase-element patterns. The present description system reduces the computation time for computing the optimal source and phase-element patterns.

As provided herein, in certain embodiments, the array description system and method includes a library of possible alternative designations (groups or patterns).

Using one or more of these designations, simple or complex element arrays can be described succinctly. In one embodiment, the library of possible alternative designations includes (i) a line designation, (ii) a column designation, (iii) a square designation, (iv) a rectangle designation, (v) a cross designation, (vi) a diagonal designation, (vii) a complex designation, (viii) a mosaic designation, (ix) an overlap designation, (x) a power designation, (xi) a border designation, (xii) a corner flip designation, (xiii) a mirror image designation, (xiv) a repeat designation, and (xv) a glide designation. However, array description system can be modified to have fewer or more designations than are provided herein. The designation system provided herein is a classification system in which the elements are organized into groups and the elements are categorized and described on the basis of identified characteristics.

Some of these designations are represented with a unique letter, number or character. However, it should be noted that the letter, number or character used for the various designations is merely for reference, and can be changed to be another type of letter, number, symbol, or character. Further, in certain embodiments, powers and brackets can be used in the description system. As utilized herein, any of the letters, numbers, symbols, characters, powers and/or brackets can be referred to generally as "characters".

Stated in another fashion, the present invention is directed to a data structure that describes an array of elements that includes a plurality of elements, with each element having one state (e.g. either zero or pi) among a plurality states. As provided herein, the data structure can include a classification of patterns, and a state of each of the elements. Further, as provided herein, the classification of patterns can be a category type. The classification of patterns can include a rotation and the state structure can include an elements number. Moreover, the state about the element can correspond to the elements number.

Figure 2A:
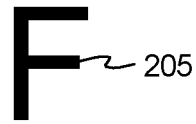
FIGS. 2A, 2B, 2C, 2D, 2E, 2F, 2G, and 2H illustrate a plurality of alternative views that can be used with the array description system provided herein.
Figure 2B:
Figure 2C:
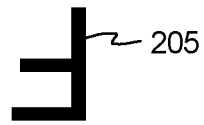
Figure 2D:
Figure 2E:
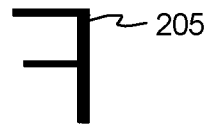
Figure 2F:
Figure 2G:
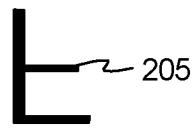
Figure 2H:

FIGS. 2A, 2B, 2C, 2D, 2E, 2F, 2G, 2H illustrate the applied application of a viewing operator for use with the description system. In one embodiment, eight alternative view operators (operate on the pixels) can be used in the description system, namely (i) view "0" illustrated in FIG. 2A is an initial view of a pattern 205 (somewhat F shaped in this example); (ii) view "1" illustrated in FIG. 2B is the pattern 205 of view 0 rotated ninety degrees counterclockwise; (iii) view "2" illustrated in FIG. 2C is the pattern 205 of view 0 rotated one hundred and eighty degrees; (iv) view "3" illustrated in FIG. 2D is the pattern 205 of view 0 rotated ninety degrees clockwise; (v) view "4" illustrated in FIG. 2E is a mirror image of the pattern 205 of view 0; (vi) view "5" illustrated in FIG. 2F is the pattern 205 of view 4 rotated ninety degrees clockwise; (vii) view "6" illustrated in FIG. 2G is the pattern 205 of view 4 rotated one hundred and eighty degrees; (viii) view "7" illustrated in FIG. 2H is the pattern 205 of view 4 rotated ninety degrees counterclockwise. As provided herein, the description system can use these view operators to define the translations, rotations and reflections of the entire element array or for element groups in the element array to simplify the descriptions.

The present description method includes a Standard Library and Classification of Patterns using Pixel Group Language. A group that is bracketed to a power creates duplicate features to that power.

Figure 3A:
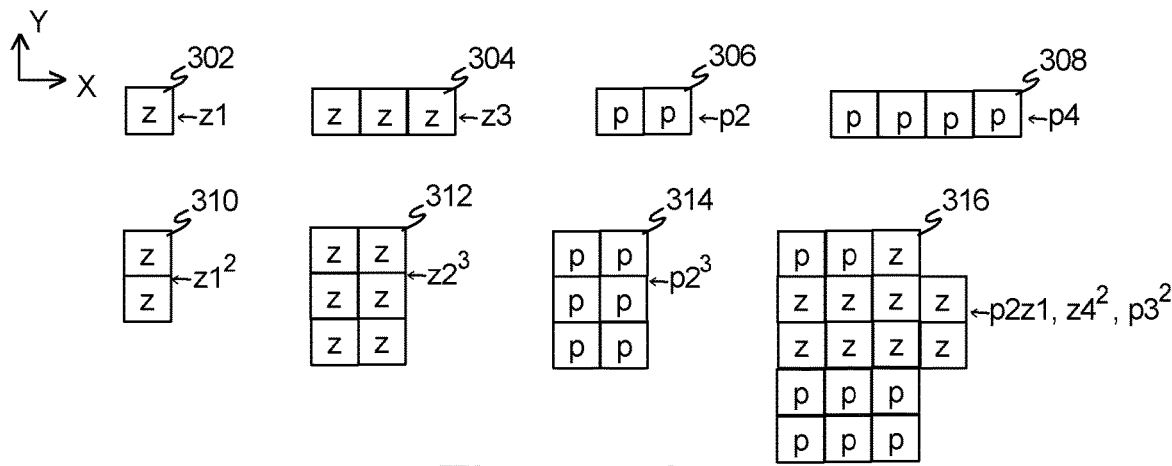
FIGS. 3A, 3B, 3C, 3D, 3E, 3F, 3G, 3H, 3I, 3J, 3K, 3L, 3M, 3N, 3O and 3P each illustrate an alternative designation that can be used with the array description system provided herein.
Figure 3B:
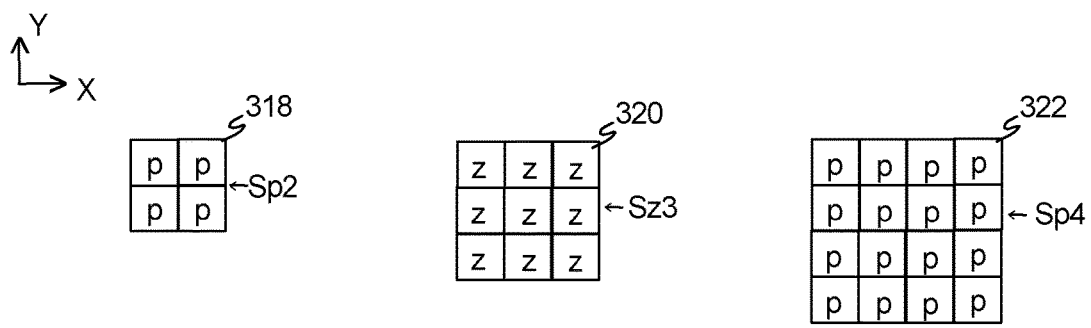
Figure 3C:
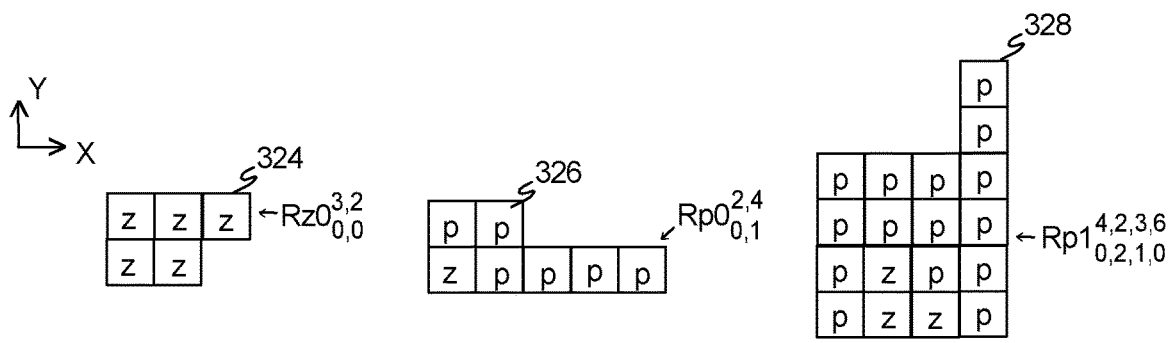
Figure 3D:
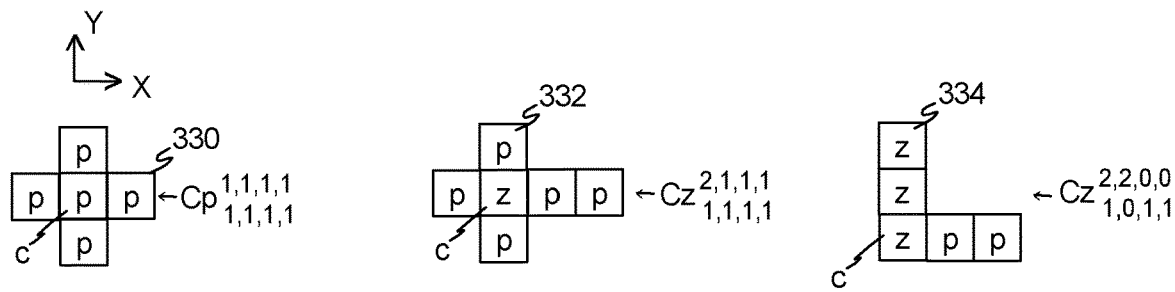
Figure 3E:
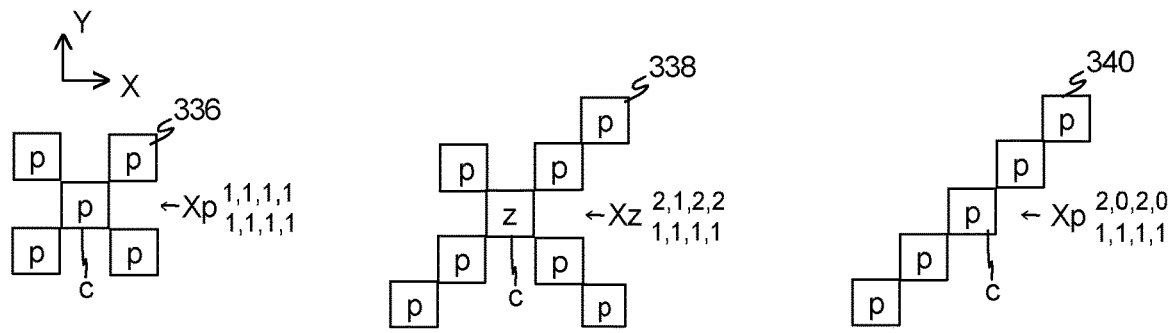
Figure 3F:
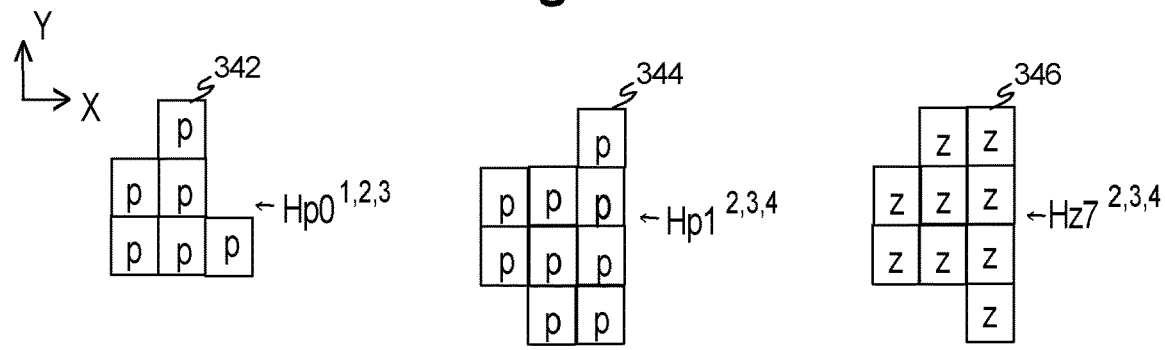
Figure 3F:
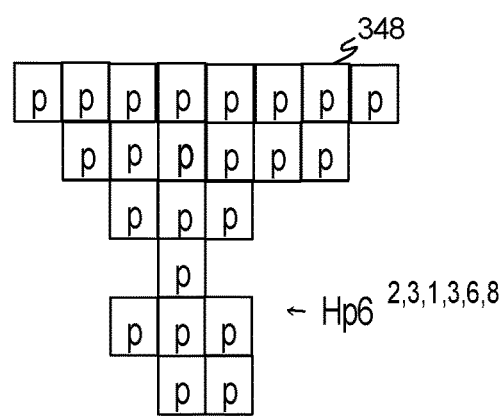
Figure 3G:
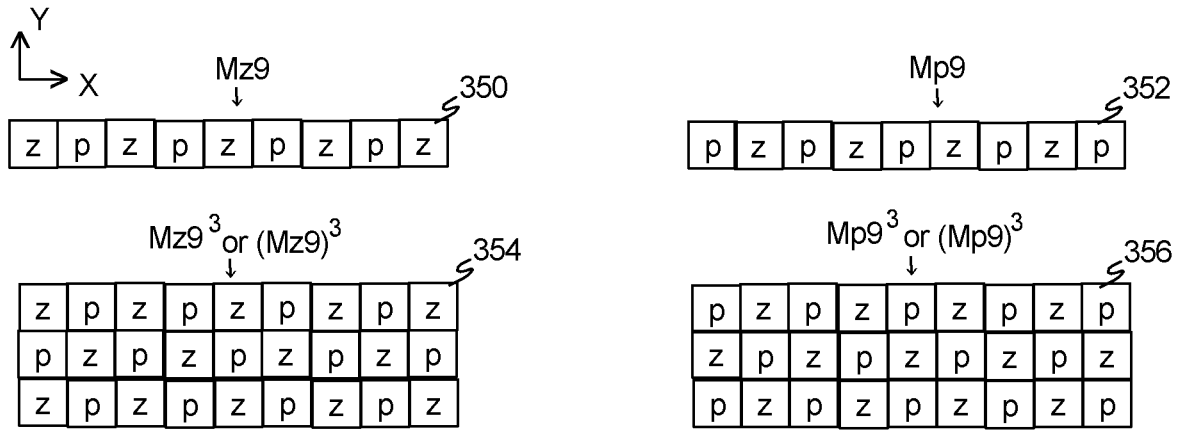
Figure 3H:
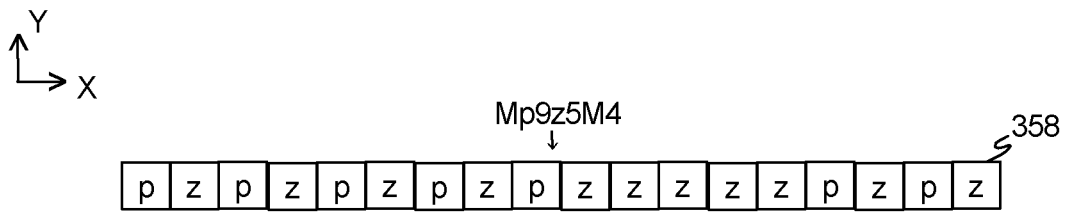
Figure 3I:
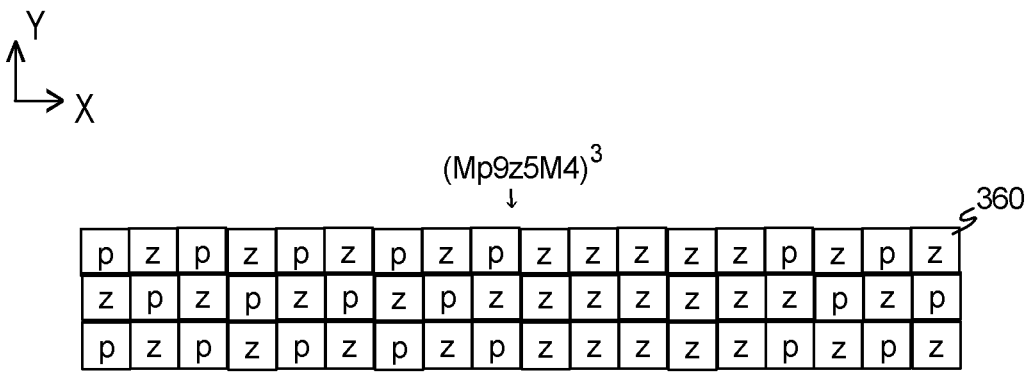
Figure 3J:
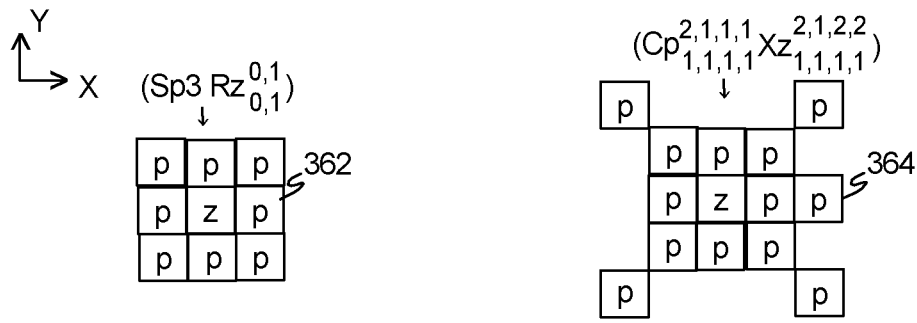
Figure 3K:
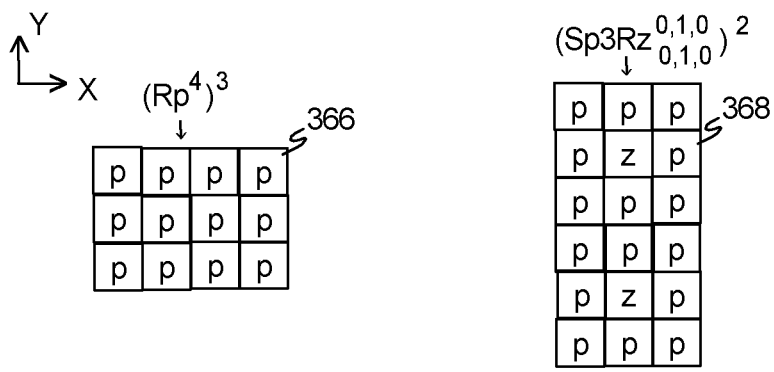
Figure 3L:
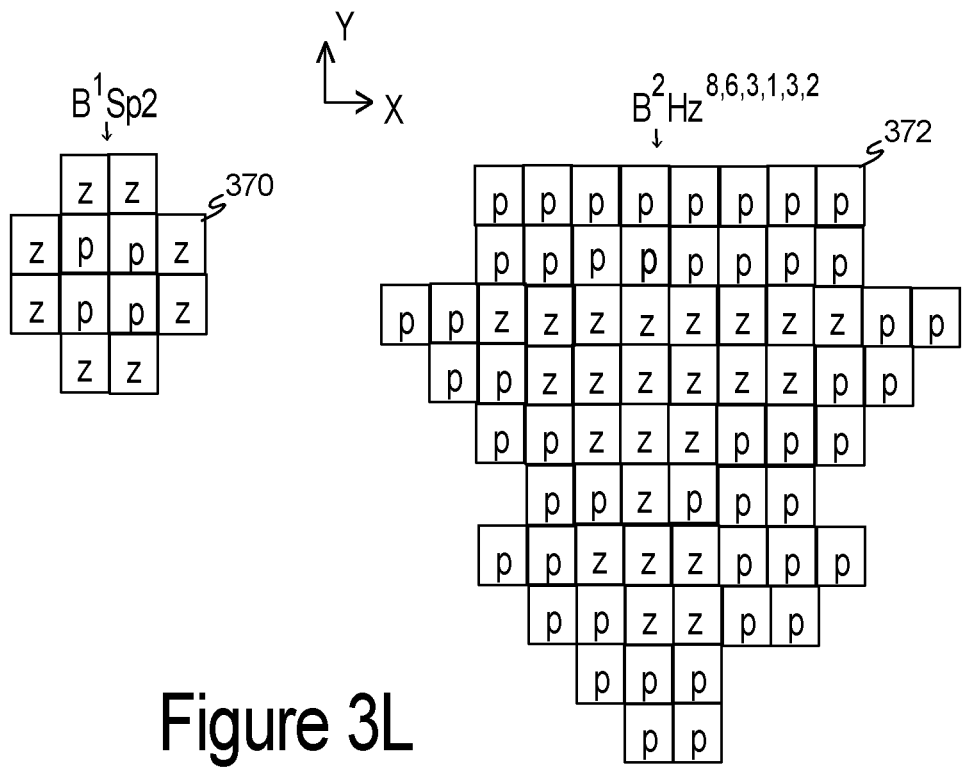
Figure 3M:
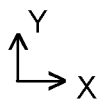
Figure 3M:
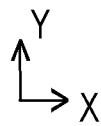
Figure 3N:
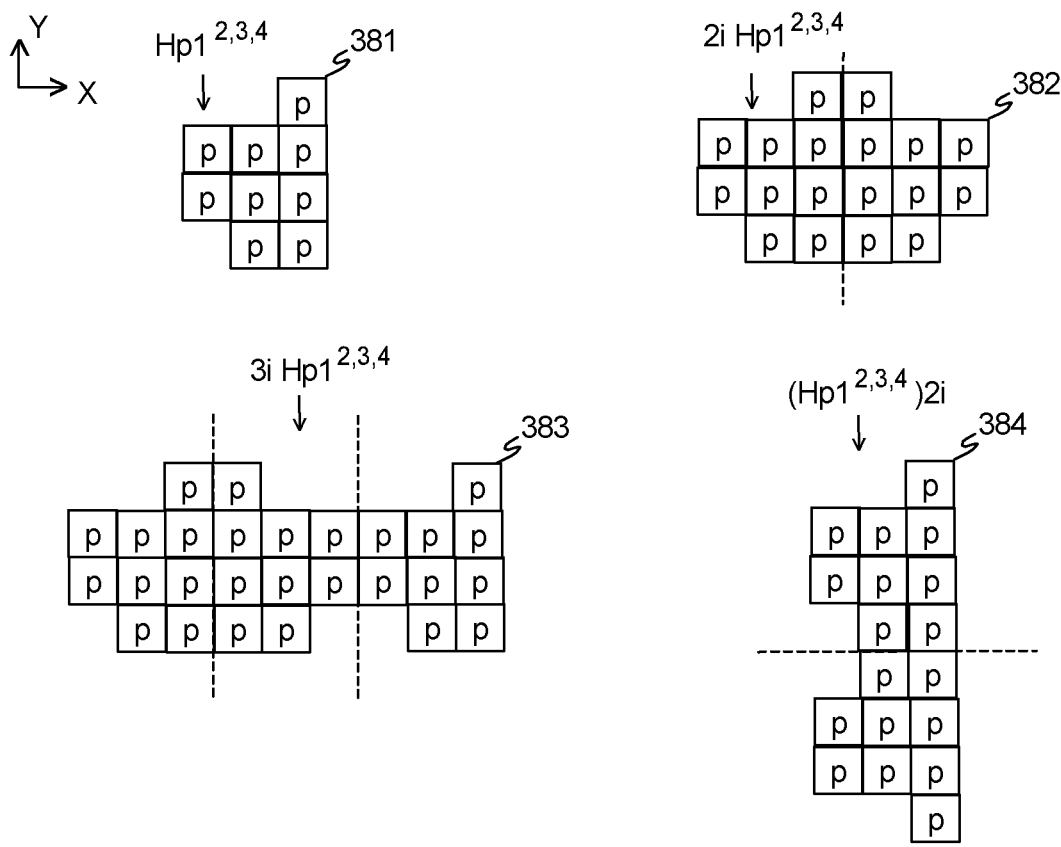
Figure 3O:
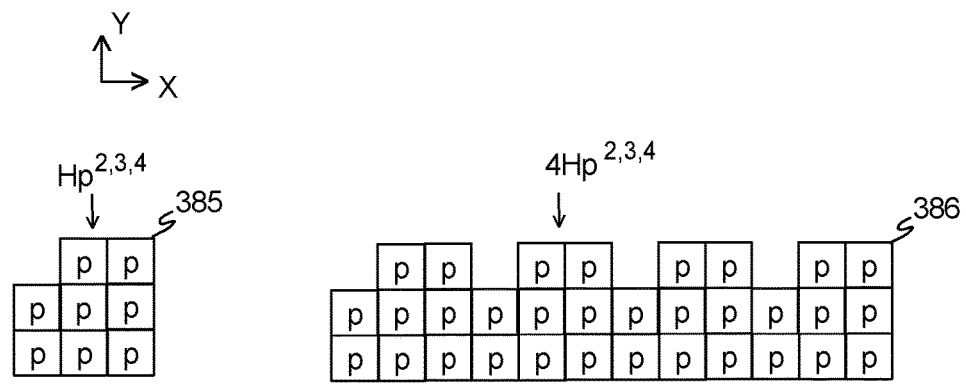
Figure 3P:
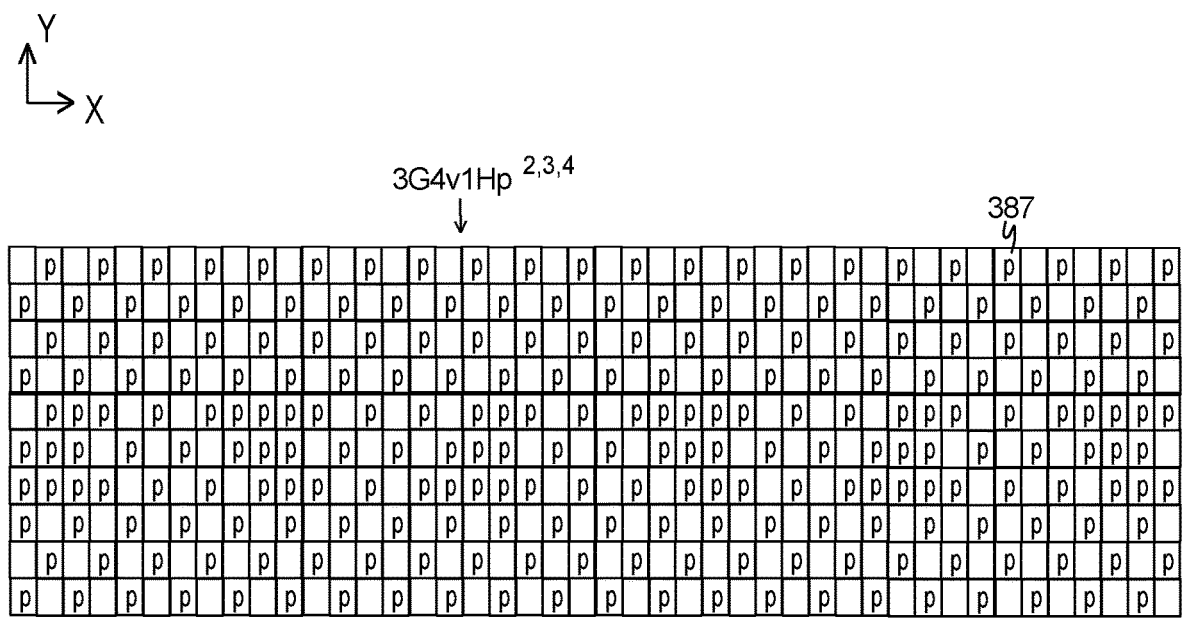

FIGS. 3A through 3P illustrate a non-exclusive example of a standard library of alternative designations that can be used in the array description system provided herein. It should be noted that the identifier used for each of the designations can be varied, and the types of designations can be varied. In the description system, the letter "z" and/or the number "0" are used to describe the zero phase of the element in the array, while the letter "p" and/or the number "1" are used to describe the pi phase of the element array. Further, in some of the Figures, the zero phase is illustrated with the letter "z" (or an empty box), while the pi phase is illustrated with the letter "p" (or with a shaded box). In this example, one of the zero phase and the pi phase can be the first element designation, and the other of zero phase and pi phase can be the second element designation in this binary array.

The line designation used to describe a group of elements organized in a line, and the column designation used to describe a group of elements organized in a column illustrated in FIG. 3A with eight alternative examples with the related array descriptions using the present description system. In FIG. 3A, the upper four illustrations are examples of how to describe a line (as referred to a "row"). The line designation can be used to describe lines in the element array. As illustrated in FIG. 3A, (i) the array description of "z1" can be used to describe a row 302 having a single, zero phase pixel; (ii) the array description of "z3" can be used to describe a row 304 having three adjacent zero phase pixels; (iii) the array description of "p2" can be used to describe a row 306 having two, adjacent pi phase pixels; and (iv) the array description of "p4" can be used to describe a row 308 having four, adjacent pi phase pixels.

In FIG. 3A, the lower four illustrations are examples of how to describe columns and rows in the element array using the line and column designation. In certain embodiments, "to the power of" is used to represent the size of the column designator (e.g. to designate the Y direction). As illustrated in FIG. 3A, (i) the array description of "z1$^2$" can be used to describe a column 310 of two adjacent zero phase pixels; (ii) the array description of "z2$^3$" can be used to describe a two by three array 312 of zero phase pixels; (iii) the array description of "p2$^3$" can be used to describe a two by three array 314 of pi phase pixels; and (iv) the array description of "p2z1, z4$^2$, p3$^2$" can be used to describe the last element array 316 illustrated in FIG. 3A. It should be noted that in the last example, that the array description describes each row, starting from the top and moving to the bottom, and that a comma separates the description of each of the rows. Thus, in certain embodiments, the present description system builds from the top down. Alternatively, the description system can build from the bottom up. Still alternatively, another type of symbol (e.g. a semi-colon) can be used to separate the rows.

The square designation can be used to describe a group of elements that are arranged in a square pattern. The square designation (represented by the symbol "S" as a non-exclusive designation) is illustrated in FIG. 3B with three alternative examples with the related description using the present description system. The square group can be used to describe elements having a square symmetry arrangement of elements. As illustrated in FIG. 3B, (i) the array description of "Sp2" can be used to describe a two by two (square) array 318 of pi phase pixels; (ii) the array description of "Sz3" can be used to describe a three by three (square) array 320 of zero phase pixels; and (iii) the array description of "Sp4" can be used to describe a four by four (square) array 322 of pi phase pixels. In this description system, (i) the (first character in the description indicates the category type that the elements are arranged (e.g. the "S" indicates a square pattern in this example), (ii) p or z (second character in description) indicates the phase of the elements in the pattern, and (iii) the number (third character in description) indicates the number of rows and columns in the pattern.

The rectangular designation can be used to describe a group of elements that are arranged in a rectangular pattern. The rectangle designation (represented by the symbol "R" as a non-exclusive designation) is illustrated in FIG. 3C with three alternative examples with the related description using the present description system. The rectangle group can be used to describe elements having a rectangle arrangement of elements with column offsets and different views. The pixel elements defined in the rectangular operation are separated by a comma to avoid confusion with rows or offsets that exceed single digit amounts, e.g. 10, 100, etc. As illustrated in FIG. 3C, (i) the array description of "Rz0$_{0,0}^{3,2}$" can be used to describe a rectangular pattern 324 having three Z phase elements in a first row, and two, Z phase elements in a second row; (ii) the array description of "Rp0$_{0,1}^{2,4}$" can be used to describe a rectangular pattern 326 having two P phase elements in a first row, and one Z phase element and four Z phase elements in a second row; and (iii) the array description of "Rp1$_{0,2,1,0}^{4,2,3,6}$" can be used to describe a rectangular pattern 328 having (a) one P phase element in a first row, (b) one P phase element in a second row, (c) four P phase elements in a third row, (d) four P phase elements in a fourth row, (e) three P phase and one Z phase elements in a fifth row, and (f) two P phase and two Z phase elements in a sixth row. In this description system, (i) the first character in the description indicates the category type that the elements are arranged (e.g. the "R" indicates a rectangular pattern in this example), (ii) p or z (second character in description) indicates the phase of the elements in the pattern, (iii) the third character (0, 1, 2, 3, 4, 5, 6, or 7) indicates the view operator (described in reference to FIGS. 2A-2H), (iv) the header (or superscript) indicates the number of elements in a row, and (v) the footer (or subscript) indicates the column offset per row.

It should be noted that the patterns 324 and 326 are described with reference to view "0" and the pattern 328 is described with reference to the view "1". Stated in another fashion, in the description of leftmost array 324 and the center array 326, the large "0" corresponds to the view operator "0" of FIG. 2A. Further, the rightmost array 328 includes a large "1" to designate that the view operator "1" of FIG. 2B was applied to rotate the entire array clockwise ninety degrees. Typically, as provided herein, the view operator is selected to achieve the easiest array description. Thus, the view operator selected will depend on the array to be described. It should be noted that the array description can vary greatly if the view operator is changed. In certain embodiments, the zero column offset and the view operator "0" are the defaults, when no values are indicated.

As provided herein, the array description can be built from the top to bottom. In the rectangle designation, Rz designates a zero pattern, while Rp designates a pi pattern.

Further, in FIG. 3C, (i) for the leftmost array 324, the upper "3" (in the header) represents three z phase elements (because of the Rz designation) in the first upper row, and the "0" (in the footer) directly below the "3" means there is not column offset in the first row, and the upper "2" (in the header) represents two z phase elements (because of the Rz designation) in the next row, and the "0" (in the footer) directly below the "2" means there is not column offset in the this row; (ii) for the middle array 326, the upper "2" (in the header) represents two pi phase elements (because of the Rp designation) in the upper row, and the "0" (in the footer) directly below the "2" means there is not column offset in the first row, and the upper "4" (in the header) represents four pi phase elements (because of the Rz designation) in the next row, and the "1" (in the footer) directly below the "4" means there is a zero element (column offset) in this row; and (iii) for the rightmost array 328, the upper "4" (in the header) represents four pi phase elements (because of the Rp designation) in the upper row, and the "0" (in the footer) directly below the "4" means there is not column offset in the upper row; the upper "2" (in the header) represents two pi phase elements (because of the Rz designation) in the next row, and the "2" (in the footer) directly below the "2" means there is a two element (column offset) in this row; the upper "3" (in the header) represents three pi phase elements (because of the Rz designation) in the next row, and the "1" (in the footer) directly below the "3" means there is a one element (column offset) in this row; the upper "6" (in the header) represents six pi phase elements (because of the Rz designation) in the bottom row, and the "0" (in the footer) directly below the "6" means there is a zero element (column offset) in this row.

The cross designation (represented by the symbol "C") is illustrated in FIG. 3D with three alternative examples with the related description using the present description system. The cross group can be used to describe a group of elements having a cross (or plus) arrangement. In FIG. 3D, the cross elements start in the middle are described counter clockwise from the +x axis. As with the rectangular operator, pixel elements in the cross operator are also separated by a comma to avoid confusion with pixel values that exceed single digit numbers. If no commas are used, then the operator will default to reading a single digit pixel count, e.g. never above 9 pixels.

As illustrated in FIG. 3D, (i) the array description of "$Cp_{1,1,1,1}^{1,1,1,1}$" can be used to describe a cross pattern 330 having one P phase element in a first row, three P phase elements in a second row, and one, P phase element in a third row; (ii) the array description of "$Cz_{1,1,1,1}^{2,1,1,1}$" can be used to describe a cross type pattern 332 having one P phase element in a first row, three P phase elements and one Z phase element in a second row, and one, P phase element in a third row; and (iii) the array description of "$Cz_{1,0,1,1}^{2,2,0,0}$" can be used to describe a cross type pattern 334 having one Z phase element in a first row, one Z phase element in a second row, and one, Z phase element and two P phase elements in a third row.

In this description system, (i) the first character in the description indicates the category type that the elements are arranged (e.g. the "C" indicates a cross pattern in this example), (ii) p or z (second character in description) indicates the phase of the center element (indicated with a small "c" in FIG. 3D) in the cross pattern, (iii) the header indicates the number of elements in a row, and (iv) the footer indicates the element phase ("0" for Z phase and "1" for P phase).

Thus, for cross pattern 330, (i) the center element has a P phase, (ii) the row to the right of center has one element (represented by the first "1" in header) that has a P phase (represented by the first "1" in footer), (iii) the row to the top of center has one element (represented by the second "1" in header) that has a P phase (represented by the second "1" in footer), (iv) the row to the left of center has one element (represented by the third "1" in header) that has a P phase (represented by the third "1" in footer), and (v) the row to the bottom of center has one element (represented by the fourth "1" in header) that has a P phase (represented by the fourth "1" in footer).

Somewhat similarly, for cross pattern 332, (i) the center element has a Z phase, (ii) the row to the right of center has two elements (represented by the first "2" in header) that have a P phase (represented by the first "1" in footer), (iii) the row to the top of center has one element (represented by the next character "1" in the header) that has a P phase (represented by the second "1" in footer), (iv) the row to the left of center has one element (represented by "1" for the third character in the header) that has a P phase (represented by the third "1" in footer), and (v) the row to the bottom of center has one element (represented by "1" for the fourth character in the header) that has a P phase (represented by the fourth "1" in footer). Again, element numbers described in the header (superscript) and footer (subscript) are separated by a comma.

Further, for cross pattern 334, (i) the center element has a Z phase, (ii) the row to the right of center has two elements (represented by the first "2" in header) that have a P phase (represented by the first "1" in footer), (iii) the row to the top of center has two elements (represented by the second "2" in header) that have a Z phase (represented by the "0" as the second character in the footer), (iv) the row to the left of center has zero elements (represented by "0" for the third character in the header) so there can be a "0" or "1" for the phase (third character in the footer), and (v) the row to the bottom of center has zero elements (represented by "0" for the fourth character in the header) so there can be a "0" or "1" for the phase (fourth character in the footer).

The diagonal designation (represented by the symbol "X") is illustrated in FIG. 3E with three alternative examples with the related description using the present description system. The diagonal group can be used to describe a group of elements having a diagonal arrangement. In this example, the phase begins at the center feature, and the elements are described counter clockwise from the +x axis.

As illustrated in FIG. 3E, (i) the array description of "$Xp_{1,1,1,1}^{1,1,1,1}$" can be used to describe a first diagonal pattern 336; (ii) the array description of "$Xz_{1,1,1,1}^{2,1,2,2}$" can be used to describe the second diagonal pattern 338; and (iii) the array description of "$Xp_{1,1,1,1}^{2,0,2,0}$" can be used to describe the third diagonal pattern 340.

In this description system, (i) the first character in the description indicates the category type that the elements are arranged (e.g. the "X" indicates a diagonal pattern in this example), (ii) p or z (second character in description) indicates the phase of the center element (indicated with a small "c" in FIG. 3E) in the diagonal pattern, (iii) the header indicates the number of elements in the diagonal, and (iv) the footer indicates the element phase ("0" for Z phase and "1" for P phase).

Thus, for diagonal pattern 336, (i) the center element has a P phase, (ii) the diagonal at forty-five degrees to the center has one element (represented by the first "1" in header) that has a P phase (represented by the first "1" in footer), (iii) the diagonal at one hundred and thirty-five degrees to the center has one element (represented by the first "1" in header) that has a P phase (represented by the first "1" in footer), (iv) the diagonal at two hundred and twenty-five degrees to the center has one element (represented by the first "1" in header) that has a P phase (represented by the first "1" in footer), and (v) the diagonal at three hundred and fifteen degrees to the center has one element (represented by the first "1" in header) that has a P phase (represented by the first "1" in footer).

Somewhat similarly, for diagonal pattern 338, (i) the center element has a Z phase, (ii) the diagonal at forty-five degrees to the center has two elements (represented by the first "2" in header) that have a P phase (represented by the first "1" in footer), (iii) the diagonal at one hundred and thirty-five degrees to the center has one element (represented by the first "1" in header) that has a P phase (represented by the first "1" in footer), (iv) the diagonal at two hundred and twenty-five degrees to the center has two elements (represented by the second "2" in header) that have a P phase (represented by the third "1" in footer), and (v) the diagonal at three hundred and fifteen degrees to the center has two elements (represented by the third "2" in header) that has a P phase (represented by the first "1" in footer).

Further, for diagonal pattern 340, (i) the center element has a P phase, (ii) the diagonal at forty-five degrees to the center has two elements (represented by the first "2" in header) that have a P phase (represented by the first "1" in footer), (iii) the diagonal at one hundred and thirty-five degrees to the center has no elements (represented by the first "0" in header) so there can be a "0" or "1" for the phase (second character in the footer), (iv) the diagonal at two hundred and twenty-five degrees to the center has two elements (represented by the second "2" in header) that have a P phase (represented by the third "1" in footer), and (v) the diagonal at three hundred and fifteen degrees to the center has no elements (represented by the second "0" (fourth character) in header) so there can be a "0" or "1" for the phase (second character in the footer).

The complex (or irregular) designation (represented by the symbol "H") is illustrated in FIG. 3F with four alternative examples with the related description using the present description system. The complex designation can be used to describe a group of elements having an irregular arrangement. In this example, the description builds center blocks (unless unmatched then defaults 1 left of center in view 0). In these examples, the different views 0, 1, 7, and 6 of FIG. 2 are utilized in the array descriptions.

As illustrated in FIG. 3F, (i) the array description of "$Hp0^{1,2,3}$" can be used to describe the irregular pattern 342 having one P phase element in a first row, two, P phase elements in a second row, and three P phase elements in a third row; (ii) the array description of "$Hp1^{2,3,4}$" can be used to describe the irregular pattern 344 having one P phase element in a first row, three P phase elements in a second row, three P phase elements in a third row, and two P phase elements in a fourth row; (iii) the array description of "$Hz7^{2,3,4}$" can be used to describe the irregular pattern 346 having (a) two Z phase elements in a first row, (b) three Z phase elements in a second row, (c) three Z phase elements in a third row, and (d) one Z phase element in a fourth row; and (iv) the array description of "$Hp6^{2,3,1,3,6,8}$" can be used to describe the irregular pattern 348 having (a) eight P phase elements in a first row, (b) six P phase elements in a second row, (c) three P phase elements in a third row, (d) one P phase element in a fourth row, (e) three P phase elements in a fifth row, and (f) two P phase elements in a sixth row.

In this description system, (i) the first character in the description indicates the category type that the elements are arranged (e.g. the "H" indicates a complex (or irregular) designation pattern in this example), (ii) p or z (second character in description) indicates the phase of the elements in the pattern, (iii) the third character (0, 1, 2, 3, 4, 5, 6, or 7) indicates the view operator (described in reference to FIGS. 2A-2H), and (iv) the header indicates the number of elements in a row.

It should be noted that the pattern 342 is described with reference to view "0", the pattern 344 is described with reference to the view "1", the pattern 346 is described with reference to view "7", and the pattern 348 is described with reference to the view "6". Typically, the view operator is selected to achieve the easiest array description.

The mosaic designation (represented by the symbol "M") is described and illustrated in FIGS. 3G, 3H, and 3I. The mosaic designation is used to describe groups of elements that alternate phase. FIG. 3G illustrates four alternative, non-exclusive mosaic patterns 350, 352, 354, 356, with the related description using the present description system. In this example, Mz and Mp describe mosaics of alternating pattern beginning with a zero- or pi-pixel, respectively. In certain embodiments, Mz is the default, if z or p is omitted, and Mz is assumed. Also, the field is assumed to be a continuous checkerboard, so after the first line is described, then the following checkerboard, unless otherwise noted in the M operator, is assumed to follow from the initial zero- or pi-pixel.

As illustrated in FIG. 3G, (i) the array description of "Mz9" can be used to describe a mosaic pattern 350 having one row with nine elements that starts with a Z phase element, (ii) the array description of "Mp9" can be used to describe a mosaic pattern 352 having one row with nine elements that starts with a p phase element, (iii) the array description of "$Mz9^3$" or "$(Mz9)^3$" can be used to describe a mosaic pattern 354 having three rows with nine elements that starts with a Z phase element, and (iv) the array description of "$Mp9^3$" or "$(Mp9)^3$" can be used to describe a mosaic pattern 356 having three rows with nine elements that starts with a P phase element.

In this description system, (i) the first character in the description indicates the category type that the elements are arranged (e.g. the "M" indicates a mosaic designation pattern in this example), (ii) p or z (second character in description) indicates the phase of the first element in the pattern, (iii) the third character indicates the number of elements in a row, and (iv) the header indicates the number of rows in the mosaic.

FIG. 3H illustrates another example of the mosaic operator. In this example, the mosaic pattern 358 includes one row of eighteen (9+5+4=18) elements and can be described as "Mp9z5M4". The pattern 358 starts with a P phase element and the mosaic continues for nine elements (mosaic designation of "Mp9"), then it is interrupted with five Z phase elements (line designation "z5"), and then the mosaic restarts again for 4 elements (mosaic designation of "M4").

FIG. 3I illustrates another mosaic pattern 360. In this example, the pattern 358 from FIG. 3H can continue for three rows (duplicate the line 358 in the digital scanner) in the array 360 and the mosaic is assumed to continue. In this example, pattern 360 can be described as "(Mp9z5M4)$^3$".

It should be noted that, in certain embodiments, the mosaic operator is a weak operator and never overwrites a geometry that is has been written. Once used, the mosaic background fill is also always assumed.

The overlap group operator is described in relation to FIG. 3J. More specifically, FIG. 3J includes two examples of the overlap group operation. It should be noted that the array description is bracketed to avoid confusion, and the second group supersedes first with color. As illustrated in FIG. 3J, (i) the array description of "Sp3Rz$_{0,1}^{0,1}$" can be used to describe the left element pattern 362, and (ii) the array description of "Cp$_{1,1,1,1}^{2,1,2,2}$Xz$_{1,1,1,1}^{2,1,2,2}$" can be used to describe the right element pattern 364.

More specifically, the left element pattern 362 is a three by three square element array having a center element at the Z phase and the outer elements with the P phase. It can be described initially with the square designation Sp3, that is overwritten with the rectangular designation Rz$_{0,1}^{0,1}$.

Further, the right element pattern 364 can be described with the cross designation Cp$_{1,1,1,1}^{2,1,2,2}$ and the diagonal designation Xz$_{1,1,1,1}^{2,1,2,2}$. It should also be noted that in the rightmost array 364 of FIG. 3J, that the z (zero phase) in X (diagonal group) overrides p (pi phase) in C (cross group). In one embodiment, if the phase of an element of the first group is different from a phase of an element in the second group, the phase of the second group will be selected. Alternatively, the overlapping groups can be handled in a different fashion than this.

The use of a power operation (designation), (represented by the symbol "P") is described in reference to FIG. 3K. As illustrated in FIG. 3K, (i) the array description of "(Rp$^4$)$^3$" can be used to describe the left array 366 having three rows of four elements that are at a P phase, and (ii) the array description of "(Sp3Rz$_{0,1,0}^{0,1,0}$)$^2$" can be used to describe the right array 368 that includes two of the array 362 described above in reference to FIG. 3J.

In certain embodiments, the array description can include a bracket to avoid confusion, and the second group supersedes first with color. The power designation is used to multiply the lines.

The border operation (designation represented by the symbol "B") is described in reference to FIG. 3L. As illustrated in FIG. 3L, (i) the array description of "B$^1$Sp2" can be used to describe the left array 370, and (ii) the array description of "B$^1$Hz6$^{8,6,3,1,3,2}$" can be used to describe the right array 372.

In this example, the left array 370 includes a two by two square element group having a P phase (Sp2), that is encircled by Z phase elements represented with B$^1$. Further, the right array 372 includes a complex/irregular portion that is similar to the irregular array 348 described in FIG. 3F (Hz$^{8,6,3,1,3,2}$) encircled by two elements having a P phase represented with B$^1$.

Thus, as provided herein, the border operation can be used to enclose an element with a perpendicular set of opposite elements, always operating on the following element. It should be noted that if only B is used, the default can be B$^1$.

The corner flip operation (designation represented by the symbol "F") is described in reference to FIG. 3M, which includes two pairs of alternative arrays that illustrate the corner flip operation ("F"). The corner flip operation is used to the change pixel type at the corner boundary on field to the opposite polarity of feature.

As illustrated in FIG. 3M, (i) the array description of "M9$^2$; M2$^7$Hz6$^{5,7^5}$ M2$^7$; M9$^2$" can be used to describe the upper left array 374; (ii) the array description of "M9$^2$; M2$^7$F(Hz6$^{5,7^5}$)M2$^7$; M9$^2$" can be used to describe the upper right array 376; (iii) the array description of "M9$^2$; M2$^7$BHz6$^{5,7^5}$M2$^7$; M2$^7$; M9$^2$" can be used to describe the lower left array 378; and (iv) the array description of "M9$^2$; M2$^7$BF(Hz6$^{5,7^5}$)M2$^7$; M9$^2$" can be used to describe the lower right array 380.

In this example, the upper right array 376 is very similar to the upper left array 374, except the phase of two of the elements (indicated with cross-hatching) in the upper right array 376 is different. Now referring to the array descriptions, this difference between the upper right array 376 and the upper left array 374 is described using the corner flip operation.

Moreover, the lower left array 378 is very similar to the upper left array 374, except the phase of nine of the elements (indicated with a small "x") in the lower left 378 is different. Now referring to the array descriptions, this difference between the upper left array 374 and the lower left array 378 is described using the border operation.

Further, the lower right array 380 is very similar to the lower left array 378, except the phase of four of the elements (indicated with a small "y") in the lower right array 380 is different. Now referring to the array descriptions, this difference between the lower right array 380 and the lower left array 378 is described using the corner flip operation.

The mirror image operation (designation represented by the symbol "i") is described in reference to FIG. 3N that includes four alternative element arrays. As provided herein, the mirror image designation can be used to provide a symmetrical flip to feature any number of time times. It should be noted that the flip can be about the x axis or about the y axis.

As illustrated in FIG. 3N, (i) the array description of "Hp1$^{2,3,4}$" can be used to describe the upper left array 381; (ii) the array description of "2iHp1$^{2,3,4}$" can be used to describe the upper right array 382; (iii) the array description of "3iHp1$^{2,3,4}$" can be used to describe the lower left array 383; and (iv) the array description of "(Hp1$^{2,3,4}$)2i" can be used to describe the lower right array 380.

In this example, the upper left array 381 is the base array. The upper right array 382 includes the base array 381 and a mirror image of the base array 381 flipped about the Y axis. This is represented by 2i at the beginning of the array description 2iHp1$^{2,3,4}$. The axis of flipping (illustrated with a dashed line) is also illustrated in the upper right array 382.

Somewhat similarly, the lower left array 383 includes the base array 381 and two mirror images of the base array 381 flipped about the Y axis. This is represented by 3i at the beginning of the array description 3iHp1$^{2,3,4}$. The two axes of flipping (illustrated with dashed lines) are also illustrated in the lower left array 383.

Further, the lower right array 384 includes the base array 381 and a mirror image of the base array 381 flipped about the X axis. This is represented by 2i at the end of the array description (Hp1$^{2,3,4}$)2i. The axis of flipping (illustrated with a dashed line) is also illustrated in the lower right array 384.

The repeat operation (designation) described in reference to FIG. 3O. The repeat operation includes a number that repeats the described feature. In this example, the repeat number is first (at the beginning of the array description), and is followed by the group to be repeated (using the same view).

As illustrated in FIG. 3O, (i) the array description of "Hp$^{2,3,4}$" can be used to describe the left array 385; and (ii) the array description of "4Hp$^{2,3,4}$" can be used to describe the right array 386. In this example, the left array 385 is the base array and the right array 386 includes the base array 385 repeated four times. This is represented by 4i at the beginning of the array description 4Hp$^{2,3,4}$.

The glide operation (designation represented by the symbol "G") is described in reference to FIG. 3P. As illustrated in FIG. 3P, the array description of "3G4v1Hp$^{2,3,4}$" can be used to describe the array 387. It should be noted that in this array 387, the elements having a Z phase have been left blank so that the glided pattern is more obvious.

The glide designation allows for the feature repeat, using different views. In this example, the array description is written with (G)(pixel separation) v(view to place) (Group). This provides feature repeat times (uses view zero and then new view). In the array illustrated in FIG. 3P, a pattern in the array 387 is repeated three times and varies between view zero and view one.

It should be noted that all of the operators that have been described operate only on the immediate pixel group to the right, and only that group, unless a parenthesis bracket is used to the right, in which case the operator performs the function on the group enclosed by the brackets. Also, the semicolon should be used to designate a new column.

Figure 4A:
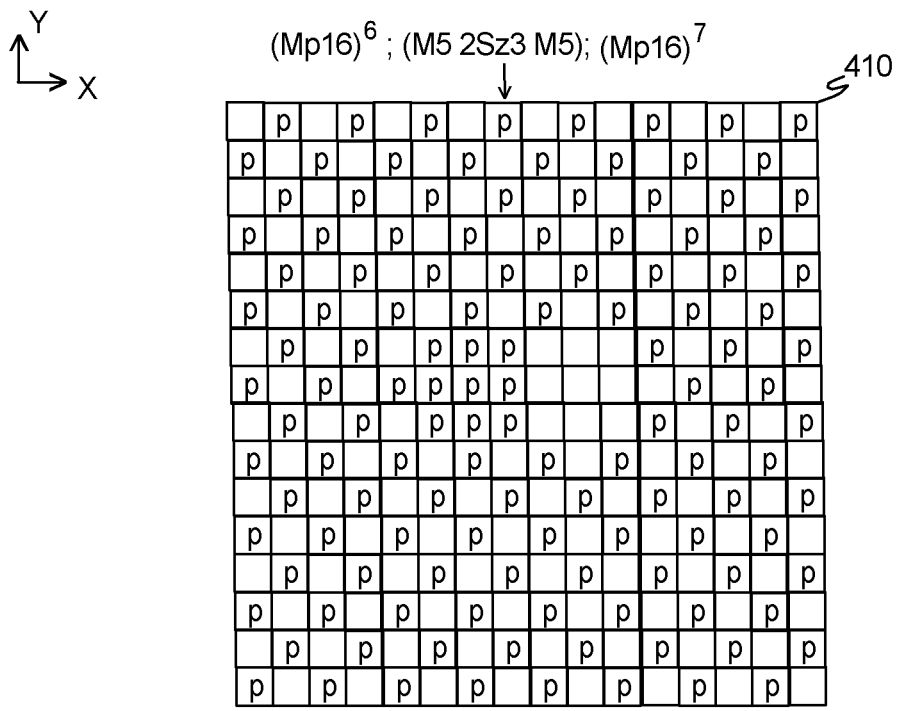
FIGS. 4A and 4B are alternative element arrays and the corresponding array descriptions.

FIG. 4A illustrates an array 410 of elements that can be described with the array description system as "(Mp16)$^6$; (M5 z3 p3 M5)$^3$; (M16)$^7$". Alternatively, the array 410 of FIG. 4A can be written as "(Mp16)$^6$; (M5 2Sz3 M5); (M16)$^7$".

Figure 4B:
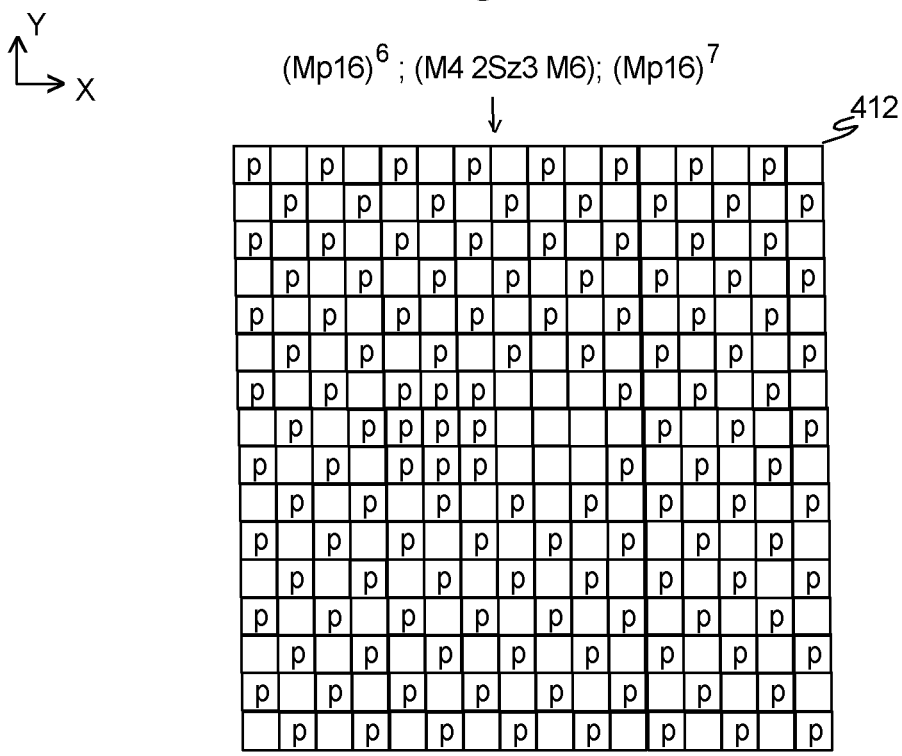

Further, FIG. 4B illustrates an array 412 of elements that is slightly different from the array 410 of FIG. 4A. The array 412 in FIG. 4B can be described with the description system as "(Mz16)$^6$; (M4 z3 p3 M6)$^3$; (M16)$^7$". Alternatively, the array 412 of FIG. 4B can be written as "(Mz16)$^6$; (M4 2Sz3 M6); (M16)$^7$".

In FIGS. 4A and 4B, the elements having a Z phase have been left blank.

The present embodiment provides an array description method to succinctly describe the progression of the mosaic with patterns for the maskless scanner. The present embodiment can be applied to both the binary and the phase-shift mirror arrays and can be used with the standard library described herein. In the examples of FIGS. 4A and 4B, the mosaic with 2 centered 3×3 squares (S$^3$) of pi- and zero-phase (p and z, respectively) are stepped from right to left by one pixel. Note that the mosaic pattern is always understood to follow from the initial pattern point (i.e., the first M$_z$ or M$_p$).

Figure 5A:
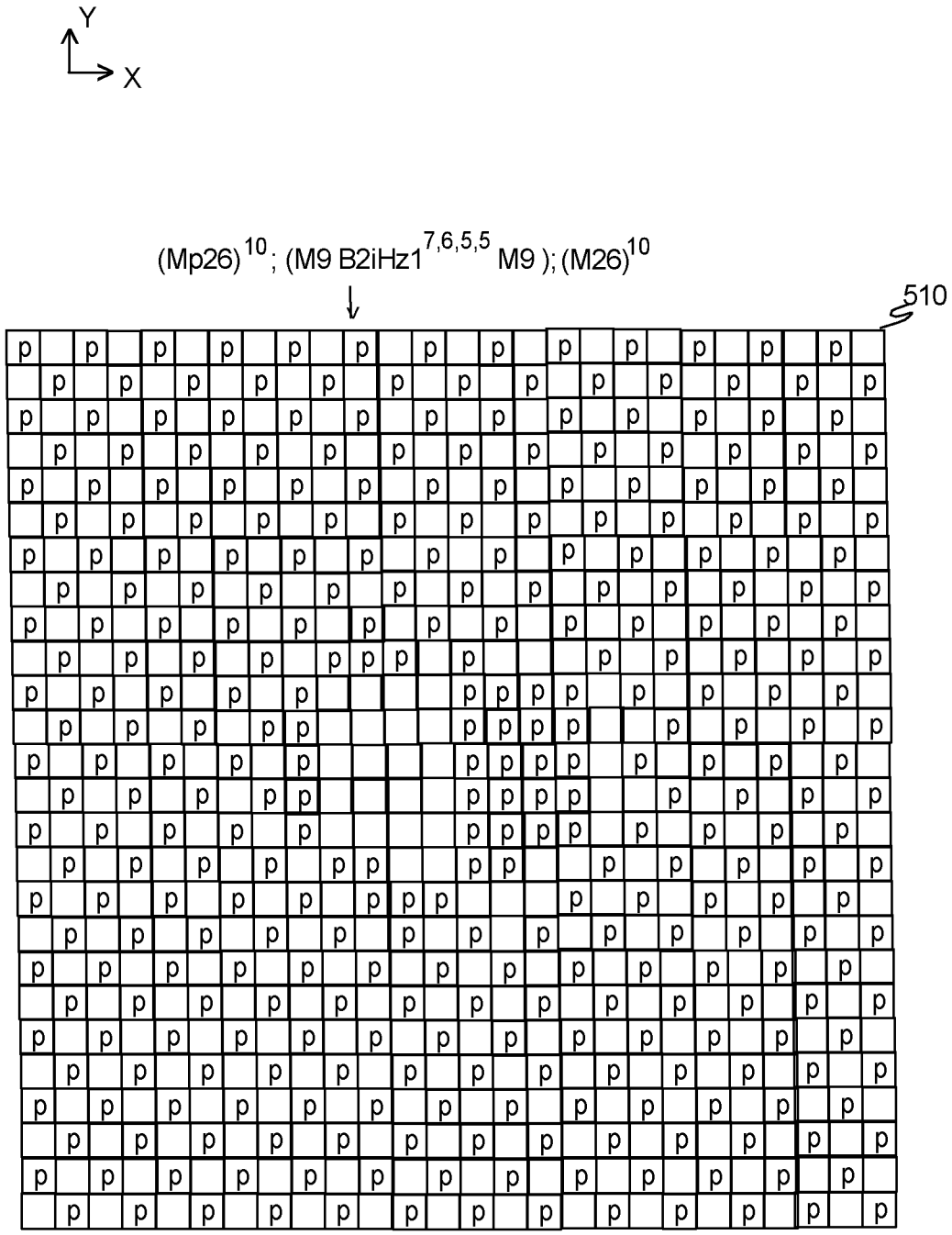

FIG. 5A illustrates another array 510 described using the description system. In FIG. 5A, the elements having a Z phase have been left blank. In this example, the array 510 can be described as (Mp26)$^{10}$; (M9 B2iHz1$^{7,6,5,5}$M9); (M26)$^{10}$.

Figure 5B:
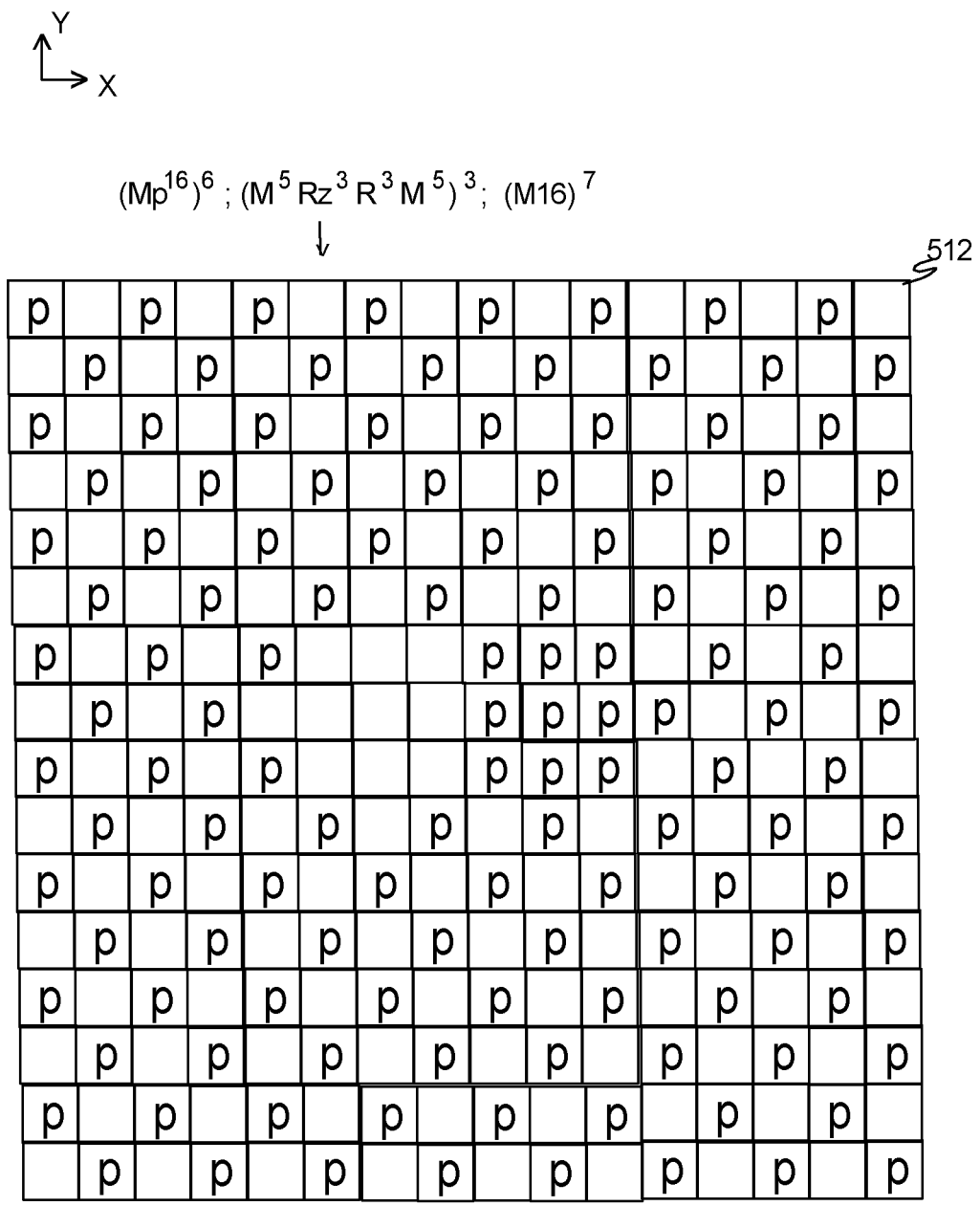

FIG. 5B illustrates another array 512 (e.g. a mirror array for a digital mask) described using the description system. In FIG. 5B, the elements having a Z phase have been left blank.

In this example, the array 512 can be described as (Mp$_{16}$)$^6$; (M$^5$ Rz$^3$ R$^3$ M$^5$)$^3$; (M$^{16}$)$^7$ using the array description method provided herein. It should be noted that if the phase of the mosaic pixel operator is not specifically defined, e.g. Mz or Mp, then the mosaic operator default to continue the previously defined mosaic pattern.

Figure 5C:
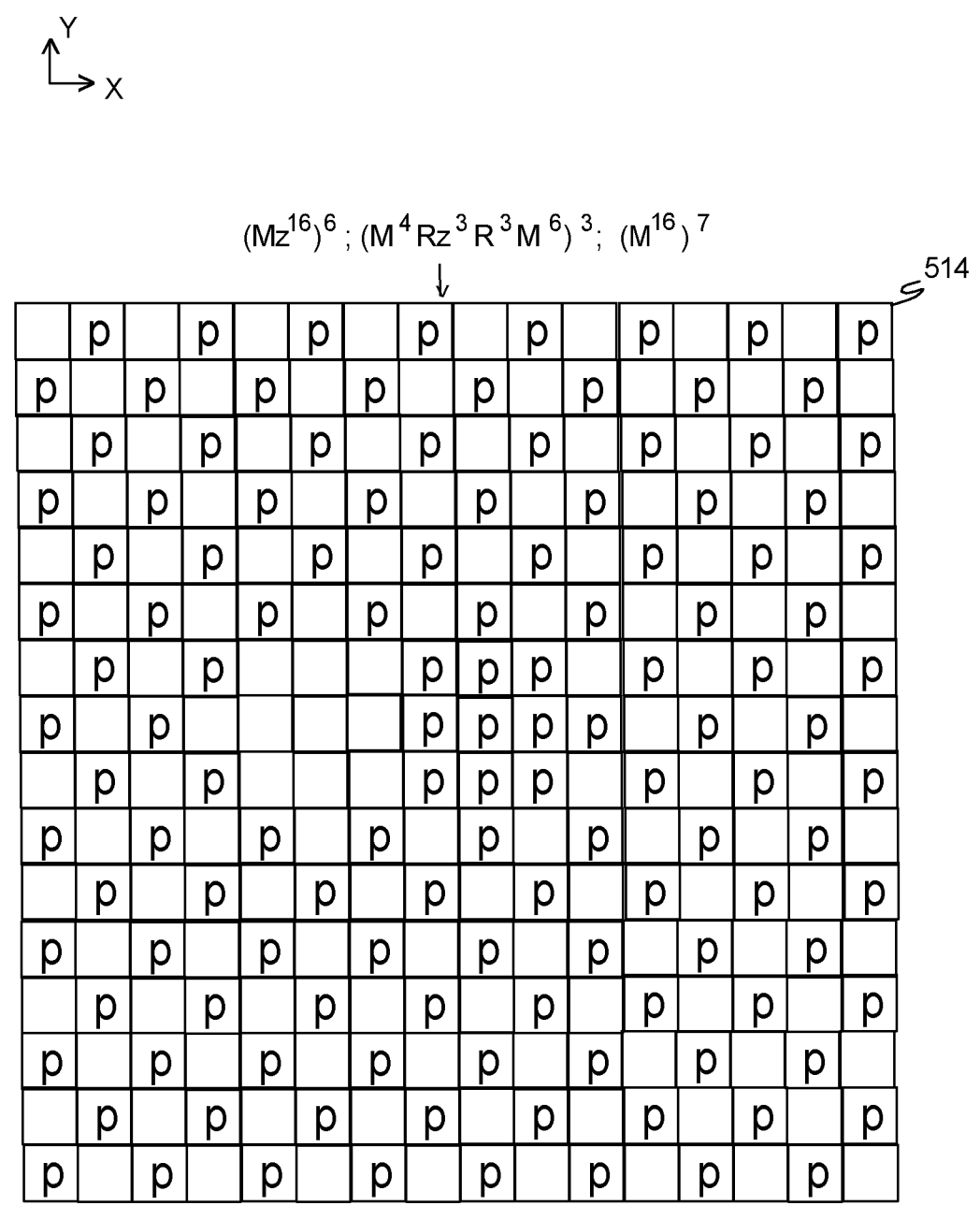

FIG. 5C illustrates another array 514 (e.g. a mirror array for a digital mask) described using the description system. In FIG. 5C, the elements having a Z phase have been left blank. In this example, the array 514 can be described as (Mz$^{16}$)$^6$; (M$^4$ Rz$^3$ R$^3$ M$^6$)$_3$; (M$^{16}$)$^7$ using the array description method provided herein. In certain embodiments, the array 514 for FIG. 5C can be a stepping sequence from the array 512 of FIG. 5B.

It should be recognized that the present array description method can be used to describe much larger arrays with elegant simplicity. It should be noted the stepping of the original pixel array involves only the outer two elements. This method may also be used inside an optimization tool to change the pattern array for OPE or SMO calculations. Also, for the binary type of mirror array we would simply change the representation of the pi-phase mirror to the binary non-reflective mirror (or off).

In certain embodiments, the start point reference and subsequent changes of the mirror array for the maskless scanner is useful in order to reduce overhead time for computing the optimal source and phase-mirror patterns. Without the description system provided herein, the computation time would likely make the maskless scanner patterning prohibitively slow and expensive.

Figure 6A:
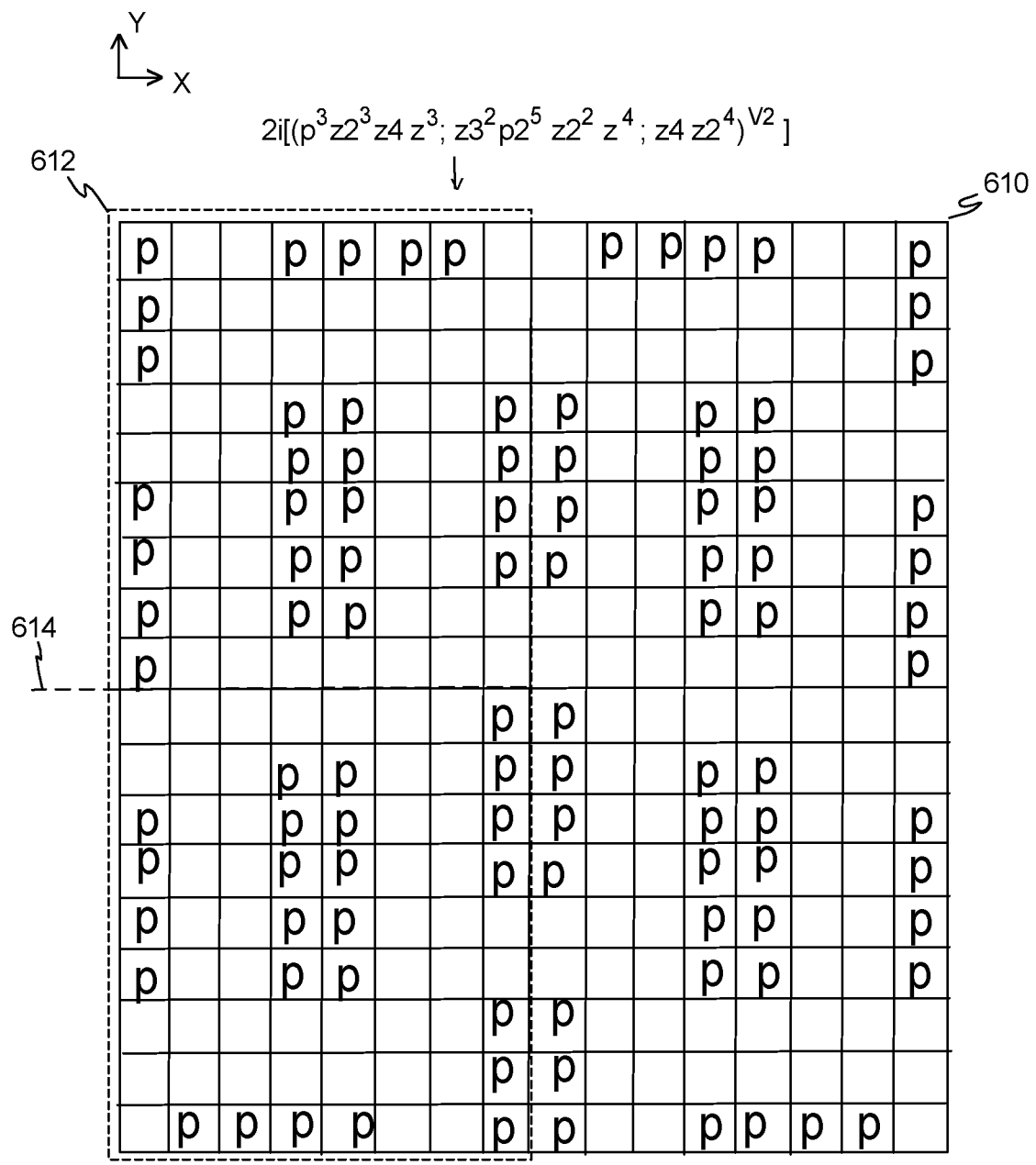

FIG. 6A illustrates yet another array 610 (e.g. a SRAM Cell) that can be succinctly described using the present description system. In this example, the mirror image operation is used to easily describe the array. More specifically, the array 610 in FIG. 6A can be described as 2i[(p$^3$ z2$^3$ z4 z$^3$; z3$^2$ p2$^5$ z2$^2$ z$^4$; z4 z2$^4$)$^{V2}$]. In this example, the 2i operates on elements enclosed by the dotted rectangle 612 (or the mirror image about the axis line 614) and creates a mirror image to the right. It should be noted that the array 610 illustrated in FIG. 6A also has rotation symmetry about the axis line 614. Thus, the array description uses the view operator V2 in the power mode to build the top left quadrant and then image (2i).

Figure 6B:
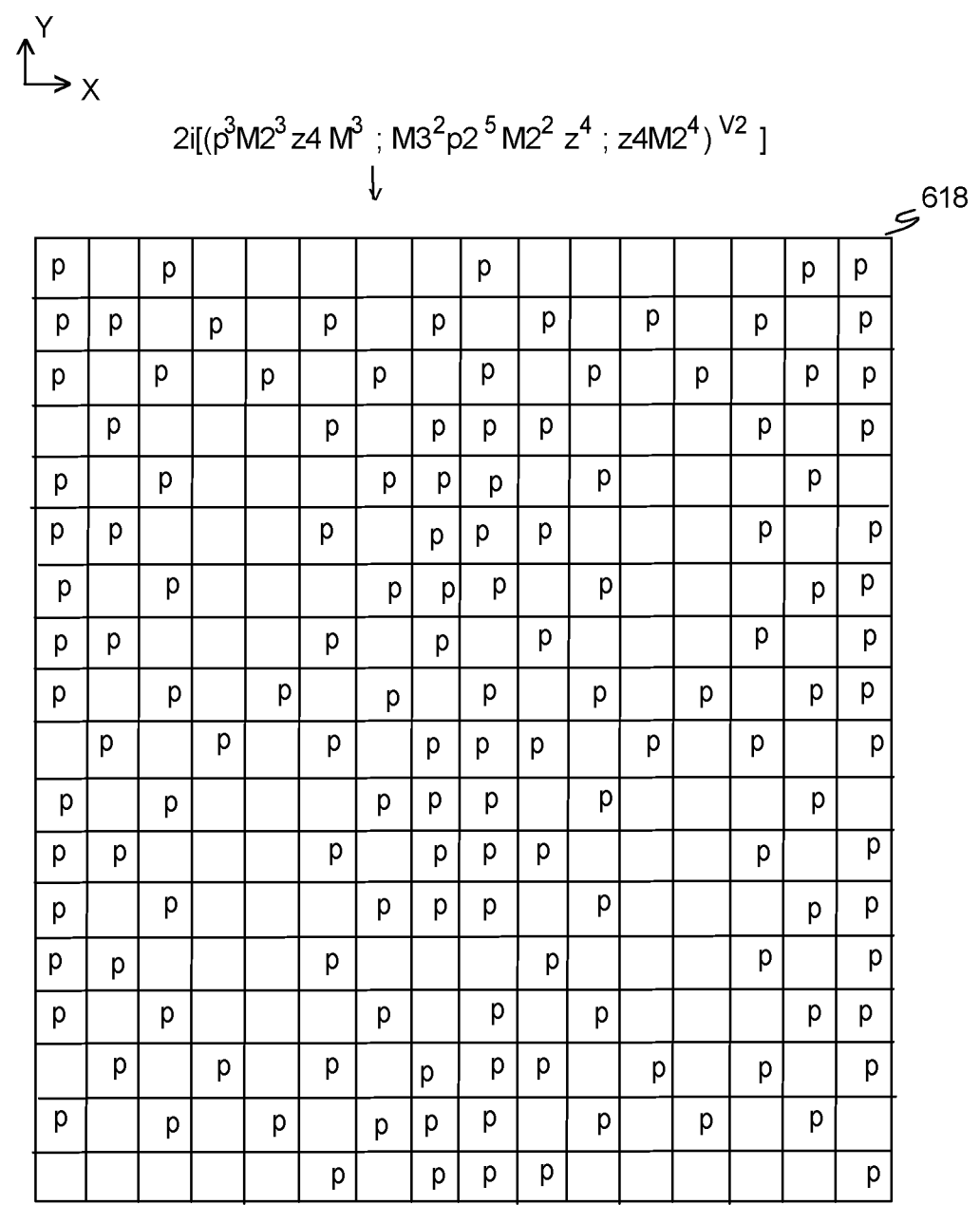

FIG. 6B illustrates yet another array (e.g. SRAM with Mosaic) that is described with the description system provided herein. In this example, the array 618 somewhat similar to the array 610 illustrated in FIG. 6A, except this array includes a mosaic pattern. The SRAM with Mosaic background can be described as 2i[(p$^3$ M2$^3$ z4 M$^3$; M3$^2$ p2$^5$ M2$^2$ z$^4$; z4 M2$^4$)$^{V2}$].

It should be noted that when the mirror image symmetry is used, the mosaic pattern is flipped in phase as well as position, but the zero and pi rectangles are mirrored but not flipped in phase. While the example in FIG. 6B could be used in a placement for a pattern, it is not useful for simulation purposes because the mirroring must be removed. The pattern only has x stepping symmetry but the y still has mirroring. The mirror can be removed using one more operation command.

Figure 6C:
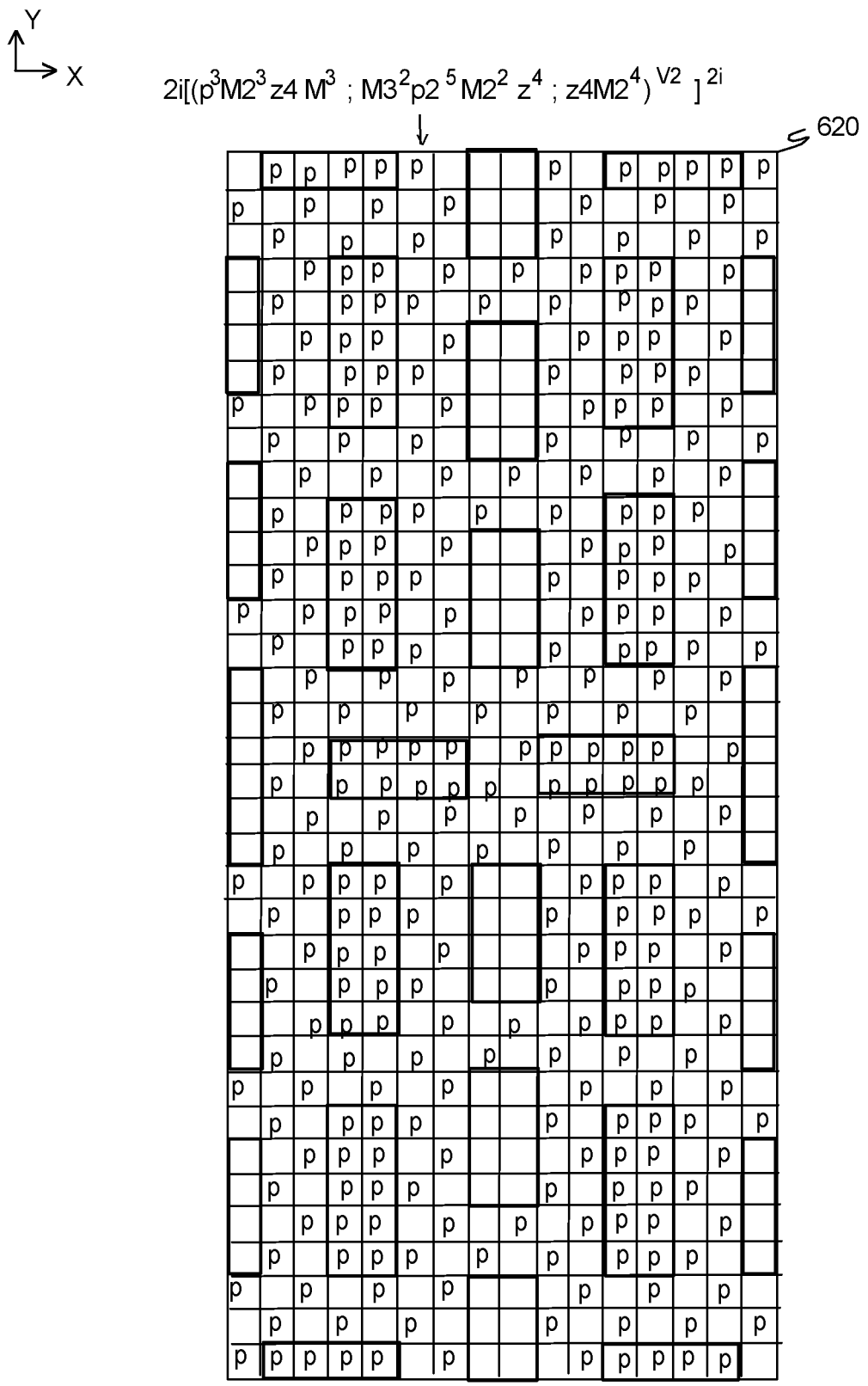

FIG. 6C illustrates the array 620 (SRAM with stepping symmetry). The array of FIG. 6C can be described as 2i[(p$^3$ M2$^3$ z4 M$^3$; M3$^2$ p2$^5$ M2$^2$ z$^4$; z4 M2$^4$)$^{V2}$]$^{2i}$. In this example, to remove the mirror, a second array image operation is used, but this time as a power to the sub-array. This yields the pattern provided in FIG. 6C. For ease of viewing, the patterns are defined with highlighted boxes.

FIG. 6D illustrates the image results for the scaled SRAM with stepping symmetry with OPE corrections. In this example, the array description of corrected pattern is: $2i[(z\ p6\ z;\ p4\ z4;\ z^5\ Mp2\ z2\ p\ z2;\ M3^2\ p2^5;\ M7^2\ z^5;\ p;\ z^5\ M^2;\ M3\ p2^5\ M2\ p;\ M7^2\ z^6;\ p^5\ M;\ M^3\ z;\ M2\ z5\ p)]^{2i}$. It should be noted that part of the symmetry (from FIG. 6D) was lost during correction which made the array description larger.

The patterns in 6A-6D represent an initial pixel group that is operated on using optical proximity correction or OPC (to improve the printability). This is a real pattern used to describe the metal-1 level of an SRAM cell. The OPC effectively destroys the symmetry (shown in FIG. 6C) and the pixel group language (PGL) then reverts to a more complex notation shown in FIG. 6D. However, with all of that said, the description still contains a high-level of compactness.

Figure 7:
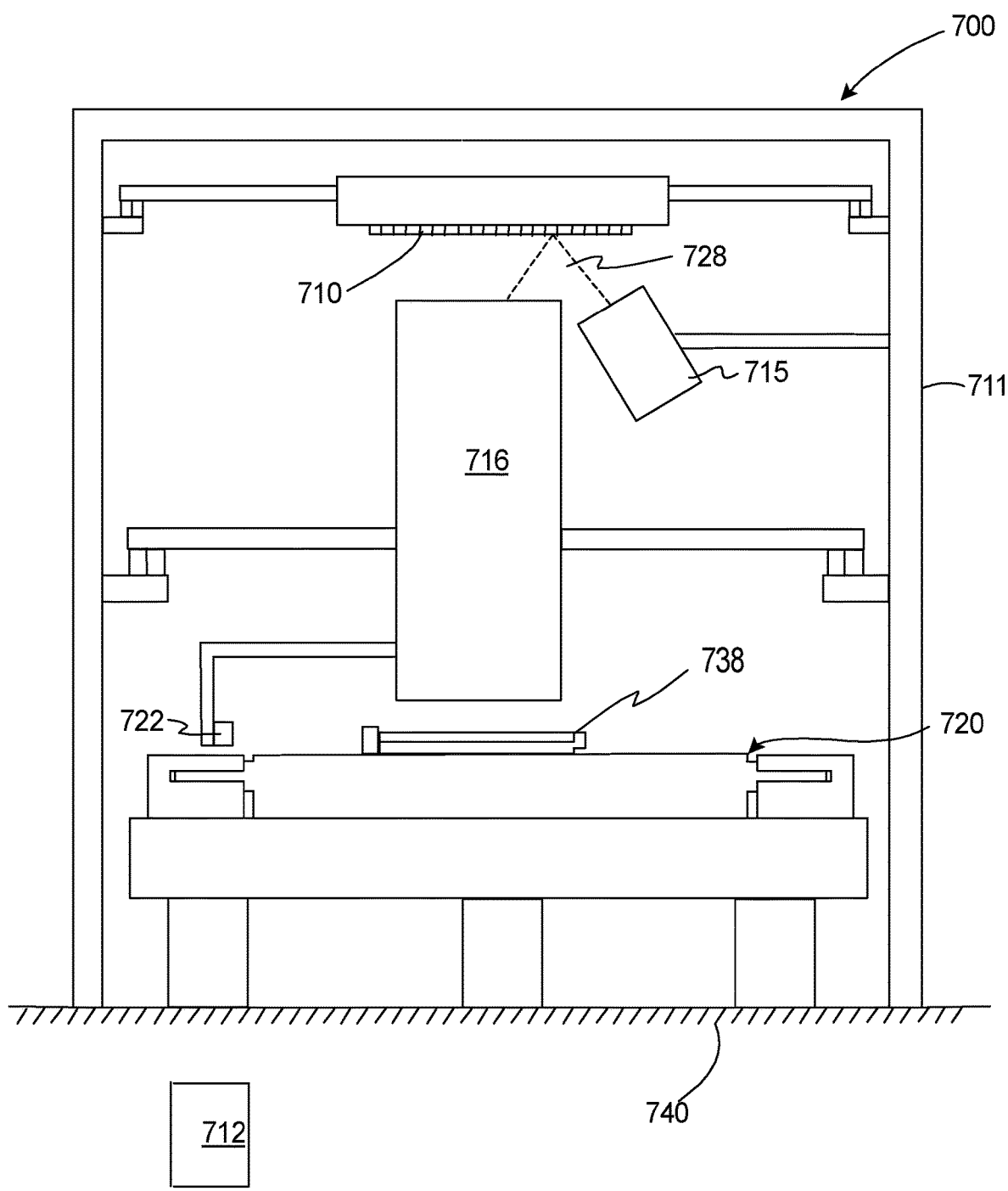
FIG. 7 is directed to a schematic view of a lithography system having features of the present embodiment.

FIG. 7 is a schematic illustration of a precision assembly, namely an exposure apparatus 700 (also referred to as a lithography apparatus) having features of the present embodiment. The exposure apparatus 700 includes an apparatus frame 711, an illumination system 715 (irradiation apparatus), an optical assembly 716, a mirror array 710 (element array), a wafer stage assembly 720, a measurement system 722, and a control system 712. The design of the components of the exposure apparatus 700 can be varied to suit the design requirements of the element array 10.

As an overview, in certain embodiments, the illumination system 715 generates an illumination beam 728 (illustrated with dashed lines) directed at the mirror array 710, and the mirror array 710 is controlled by the control system 712 to transfer an image to a wafer 738. The control system 712 may include the control system 12 of the above embodiment. Additionally, the control system 712 may control the mirror array 710 with the array description system of the above embodiments. The control system 712 may read mirror array control data from an upper device (not shown) comprising a work station and the like. Here, the mirror array control data may be described by the array description system. In this case, the upper device may include the array description system.

The exposure apparatus 700 is particularly useful as a lithographic device that transfers a pattern (not shown) of an integrated circuit created by the light on the mirror array 710 onto the semiconductor wafer 738. The exposure apparatus 700 mounts to a mounting base 740, e.g., the ground, a base, or floor or some other supporting structure.

The wafer 738 includes a substrate that is covered with a photoresist. The photoresist can be photosensitive to some wavelengths of radiation and not sensitive to other wavelengths of radiation. For example, the photoresist can be sensitive to extreme electromagnetic ultraviolet radiation including wavelengths in the 10 to 15 nm range.

The apparatus frame 711 is rigid and supports the components of the exposure apparatus 700.

In one embodiment, the illumination source 715 generates the light 728 directed at the mirror array 710. The design of the illumination source 715 will vary according to the desired wavelength of the light 728.

The output optical assembly 716 collects and focuses the illumination beam 728 that is reflected from the mirror array 710. The optical assembly 716 can be referred to as a projection optical assembly.

The wafer stage assembly 720 holds and positions the wafer 738 with respect to the projected image from the mirror array 710.

In one embodiment, one or more linear motors can be used in wafer stage assembly 720. When linear motors (see U.S. Pat. No. 5,623,853 or 5,528,118) are used, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, the wafer stage 720 could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

The measurement system 722 monitors movement of the wafer 738 relative to the optical assembly 716 or some other reference. With this information, the control system 712 can control the mirror array 710 and the wafer stage assembly 720 to precisely position the wafer 738. For example, the measurement system 722 can utilize multiple laser interferometers, encoders, and/or other measuring devices.

The control system 712 is connected to the wafer stage assembly 720, the measurement system 722, and the mirror array 710. The control system 712 receives information from the measurement system 722 and controls the stage mover assemblies 720, and the mirror array 710. For example, the control system 712 can control the mirror array 710 to individually drive and position each of the elements of the mirror array 710. The control system 24 can include one or more processors and circuits. Further the description system provided herein can be used to describe the desired status of the elements of the array 710 to the control system 24.

In one embodiment, the exposure apparatus can be modified according to teachings of U.S. Patent Publication Application Nos. 2013/0278912, or 2013/0314683.

With this design, the exposure apparatus 700 can expose a workpiece (e.g. a wafer 738) with exposure light via the array of elements 710. Further, the exposure apparatus 700 can form a pattern of a photosensitive layer on the substrate 738, using the exposure method provided herein. Further, the substrate 738 can be processed with the pattern formed thereon.

In certain embodiments, the array of elements 710 which is arranged on the object side of the projection optical system 716, and each of the element of the array of elements 710 are individually controllable so as to guide the exposure light 728 to the projection optical system 716.

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 8A:
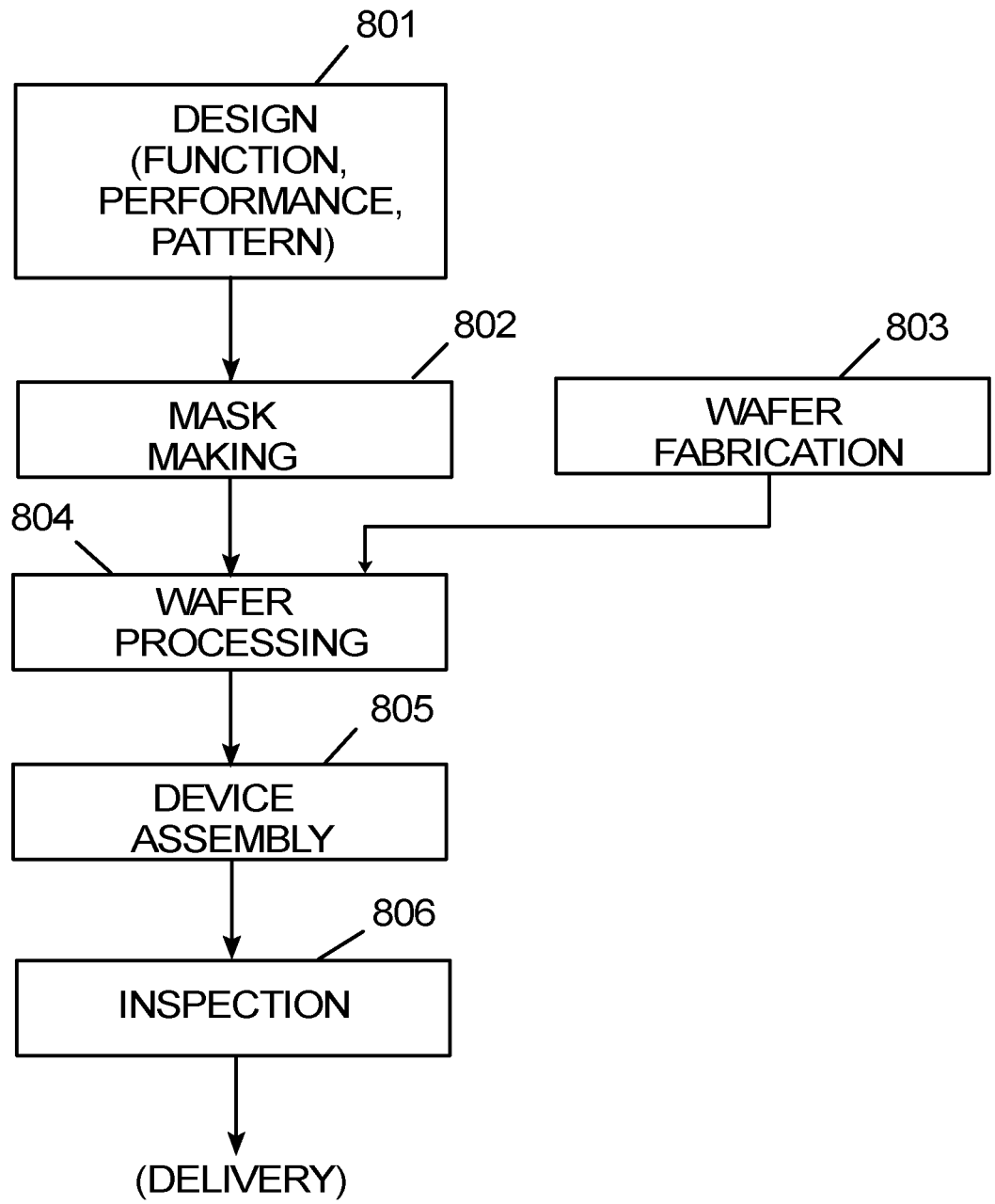
FIG. 8A is a flow chart that outlines a process for manufacturing a device in accordance with the present embodiment.

Semiconductor devices can be fabricated using the above described systems, by the process shown generally in FIG. 8A. In step 801 the device's function and performance characteristics are designed. And the designed pattern data (pattern layout) is genarated. Next, in step 802, array description data is prepared according to the previous embodiments, and in a parallel step 803 a wafer is made from a silicon material. The pattern described in step 802 is exposed onto the wafer from step 803 in step 804 by a photolithography system described hereinabove in accordance with the present embodiment. In step 805, the semiconductor device is assembled (including the dicing process, bonding process and packaging process), finally, the device is then inspected in step 1306.

Figure 8B:
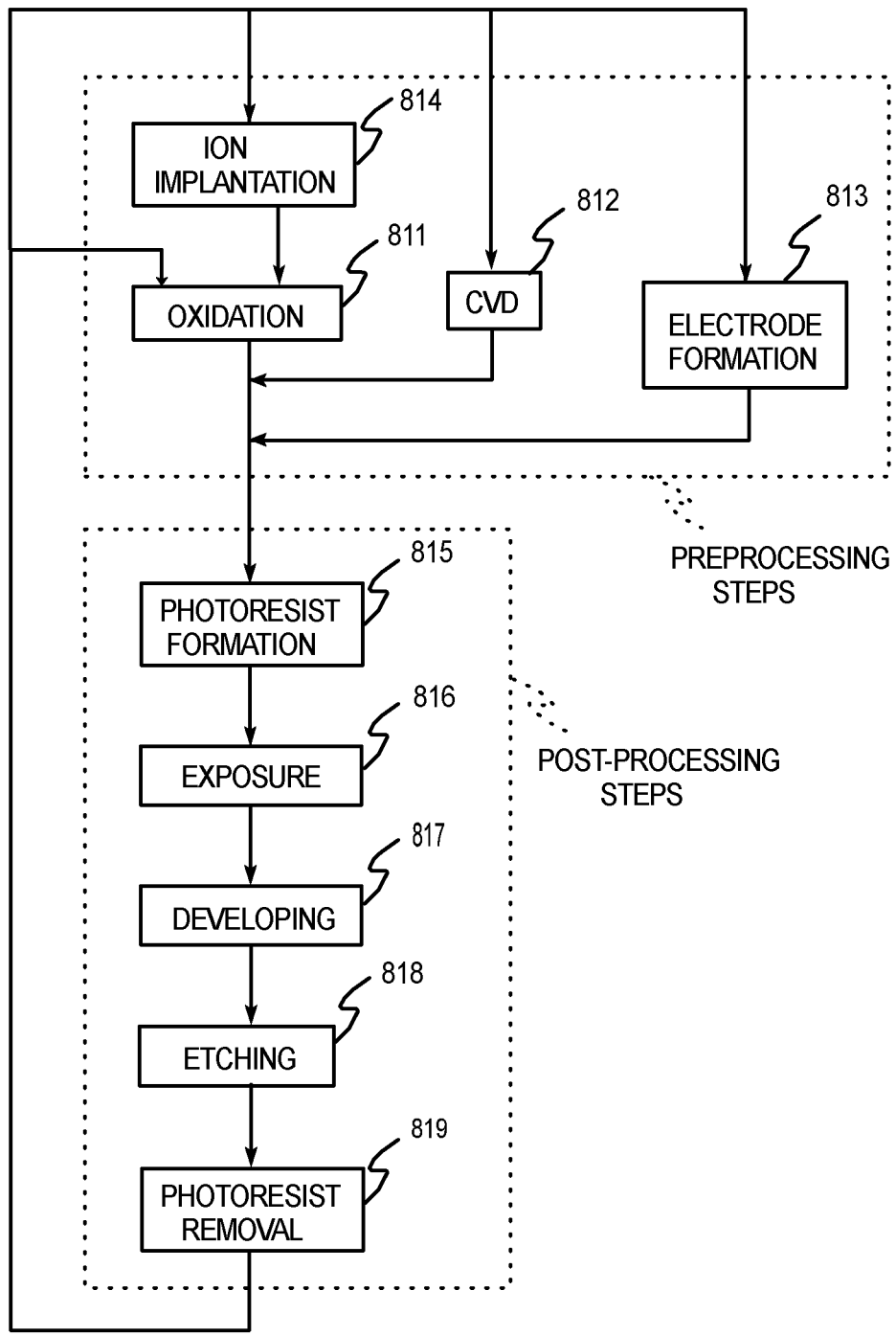
FIG. 8B is a flow chart that outlines device processing in more detail.

FIG. 8B illustrates a detailed flowchart example of the above-mentioned step 804 in the case of fabricating semiconductor devices. In FIG. 8B, in step 811 (oxidation step), the wafer surface is oxidized. In step 812 (CVD step), an insulation film is formed on the wafer surface. In step 813 (electrode formation step), electrodes are formed on the wafer by vapor deposition. In step 814 (ion implantation step), ions are implanted in the wafer. The above mentioned steps 811-814 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 815 (photoresist formation step), photoresist is applied to a wafer. Next, in step 816 (exposure step), the above-mentioned exposure device is used to transfer the circuit pattern of a mask (reticle) to a wafer. Then in step 817 (developing step), the exposed wafer is developed, and in step 818 (etching step), parts other than residual photoresist (exposed material surface) are removed by etching. In step 819 (photoresist removal step), unnecessary photoresist remaining after etching is removed. Multiple circuit patterns are formed by repetition of these preprocessing and post-processing steps.

While the method and system as shown and disclosed herein is fully capable of obtaining the objects and providing the advantages herein before stated, it is to be understood that it is merely illustrative of the presently preferred embodiments of the invention and that no limitations are intended to the details of construction or design herein shown.

What is claimed is:

1. An exposure method for exposing a workpiece with light, the exposure method comprising:
providing a plurality of movable optical elements that direct the light to expose the workpiece, the plurality of movable optical elements being arranged on an arranged surface, the plurality of movable optical elements including at least a first movable optical element and a second movable optical element, each of the movable optical elements having a state that is individually movable between at least a first state and a second state;
identifying a first desired state of each of the plurality of movable optical elements such that the movable optical elements expose the workpiece to form a first exposure pattern on the workpiece;
utilizing one or more alternative designations to generate a first data structure that describes the first desired state for each of the plurality of movable optical elements necessary to form the first exposure pattern on the workpiece, the first data structure including (i) a first, letter, number, symbol or character that represents an arranged pattern of optical elements within the plurality of movable optical elements, and (ii) a second, letter, number, symbol or character that represents the state of the optical elements in the arranged pattern;
identifying a second desired state of each of the plurality of movable optical elements such that the movable optical elements expose the workpiece to form a second exposure pattern on the workpiece that is different than the first exposure pattern;
utilizing the one or more alternative designations to generate a second data structure that describes the second desired state for each of the plurality of movable optical elements necessary to form the second exposure pattern on the workpiece;
setting the state of each of the plurality of movable optical elements by using the first data structure so that the plurality of movable optical elements are arranged in a first pattern of elements in accordance with the first data structure;
exposing the workpiece by using the light directed via the plurality of movable optical elements while the plurality of movable optical elements are arranged in the first pattern of elements to form the first exposure pattern on the workpiece;
setting the state of each of the plurality of movable optical elements by using the second data structure so that the plurality of movable optical elements are arranged in a second pattern of elements in accordance with the second data structure; and
exposing the workpiece by using the light directed via the plurality of movable optical elements while the plurality of movable optical elements are arranged in the first pattern of elements to form the first exposure pattern on the workpiece.

2. The exposure method of claim 1, wherein the first state includes the movable optical elements directing the light with a first phase and the second state includes the movable optical elements directing the light with a second phase that is different from the first phase.

3. The exposure method of claim 1, wherein the first pattern of elements includes a first arrangement of the plurality of movable optical elements, and wherein the second pattern of elements includes a second arrangement of the plurality of movable optical elements that is different from the first arrangement.

4. The exposure method of claim 1, wherein the one or more alternative designations include at least one of (i) a line designation, (ii) a column designation, (iii) a square designation, (iv) a rectangle designation, (v) a cross designation, (vi) a diagonal designation, (vii) a complex designation, (viii) a mosaic designation, (ix) an overlap designation, (x) a power designation, (xi) a border designation, (xii) a corner flip designation, (xiii) a mirror image designation, (xiv) a repeat designation, and (xv) a glide designation.

5. The exposure method of claim 1, further comprising individually positioning each of the plurality of movable optical elements at a moment in time so that a first portion of the plurality of movable optical elements is positioned to form a first pattern at the moment in time and a second portion of the plurality of movable optical elements is positioned to form a second pattern at the moment in time.

6. The exposure method of claim 5, wherein at the moment in time, the first movable optical element is at the first state and is part of the first pattern; and wherein at the moment in time, the second movable optical element is at the second state and is part of the second pattern.

7. The exposure method of claim 5, wherein the first portion of the plurality of movable optical elements includes a first number of elements, and the second portion of the plurality of movable optical elements includes a second number of elements that is different than the first number of elements.

8. The exposure method of claim 1, wherein each of the one or more alternative designations includes a plurality of characters including a pattern character that indicates a pattern of the plurality of movable optical elements, and wherein the number of characters utilized in each of the one or more alternative designations varies depending upon the pattern of the plurality of movable optical elements.

9. The exposure method of claim 1, wherein each of the one or more alternative designations includes a view operator.

10. An exposure apparatus which exposes a workpiece with light, the exposure apparatus comprising:
a plurality of movable optical elements that direct the light to expose the workpiece, the plurality of movable optical elements being arranged on an arranged surface, the plurality of movable optical elements including at least a first movable optical element and a second movable optical element, each of the movable optical elements having a state that is individually movable between at least a first state and a second state; and
a controller which controls the state of each of the plurality of movable optical elements, the controller being configured to:
identify a first desired state of each of the plurality of movable optical elements such that the movable optical elements expose the workpiece to form a first exposure pattern on the workpiece;
utilize one or more alternative designations to generate a first data structure that describes the first desired state for each of the plurality of movable optical elements necessary to form the first exposure pattern on the workpiece, the first data structure including (i) a first, letter, number, symbol or character that represents an arranged pattern of optical elements within the plurality of movable optical elements, and (ii) a second, letter, number, symbol or character that represents the state of the optical elements in the arranged pattern;
identify a second desired state of each of the plurality of movable optical elements such that the movable optical elements expose the workpiece to form a second exposure pattern on the workpiece that is different than the first exposure pattern;
utilize the one or more alternative designations to generate a second data structure that describes the second desired state for each of the plurality of movable optical elements necessary to form the second exposure pattern on the workpiece;
set the state of each of the plurality of movable optical elements by using the first data structure so that the plurality of movable optical elements are arranged in a first pattern of elements in accordance with the first data structure;
expose the workpiece by using the light directed via the plurality of movable optical elements while the plurality of movable optical elements are arranged in the first pattern of elements to form the first exposure pattern on the workpiece;
set the state of each of the plurality of movable optical elements by using the second data structure so that the plurality of movable optical elements are arranged in a second pattern of elements in accordance with the second data structure; and
expose the workpiece by using the light directed via the plurality of movable optical elements while the plurality of movable optical elements are arranged in the first pattern of elements to form the first exposure pattern on the workpiece.

11. The exposure apparatus of claim 10, wherein the first state includes the movable optical elements directing the light with a first phase and the second state includes the movable optical elements directing the light with a second phase that is different from the first phase.

12. The exposure apparatus of claim 10, wherein the first pattern of elements includes a first arrangement of the plurality of movable optical elements, and wherein the second pattern of elements includes a second arrangement of the plurality of movable optical elements that is different from the first arrangement.

13. The exposure apparatus of claim 10, wherein the one or more alternative designations include at least one of (i) a line designation, (ii) a column designation, (iii) a square designation, (iv) a rectangle designation, (v) a cross designation, (vi) a diagonal designation, (vii) a complex designation, (viii) a mosaic designation, (ix) an overlap designation, (x) a power designation, (xi) a border designation, (xii) a corner flip designation, (xiii) a mirror image designation, (xiv) a repeat designation, and (xv) a glide designation.

14. The exposure apparatus of claim 10, wherein the controller is further configured to individually position each of the plurality of movable optical elements at a moment in time so that a first portion of the plurality of movable optical elements is positioned to form a first pattern at the moment in time and a second portion of the plurality of movable optical elements is positioned to form a second pattern at the moment in time.

15. The exposure apparatus of claim 14, wherein at the moment in time, the first movable optical element is at the first state and is part of the first pattern; and wherein at the moment in time, the second movable optical element is at the second state and is part of the second pattern.

16. The exposure apparatus of claim 14, wherein the first portion of the plurality of movable optical elements includes a first number of elements, and the second portion of the plurality of movable optical elements includes a second number of elements that is different than the first number of elements.

17. The exposure apparatus of claim 10, wherein each of the one or more alternative designations includes a plurality of characters including a pattern character that indicates a pattern of the plurality of movable optical elements, and wherein the number of characters utilized in each of the one or more alternative designations varies depending upon the pattern of the plurality of movable optical elements.

18. The exposure apparatus of claim 10, wherein each of the one or more alternative designations includes a view operator.

* * * * *